(12) United States Patent
Kitagawa

(10) Patent No.: US 7,486,571 B2
(45) Date of Patent: Feb. 3, 2009

(54) SEMICONDUCTOR MEMORY DEVICE

(75) Inventor: Makoto Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 73 days.

(21) Appl. No.: 11/822,464

(22) Filed: Jul. 6, 2007

(65) Prior Publication Data

US 2008/0025113 A1    Jan. 31, 2008

(30) Foreign Application Priority Data

Jul. 27, 2006   (JP)   ............................ 2006-204800

(51) Int. Cl.
*G11C 7/22* (2006.01)
(52) U.S. Cl. ........................... 365/189.05; 365/189.15; 365/189.16; 365/189.17; 365/189.19
(58) Field of Classification Search ............ 365/189.17, 365/189.19
See application file for complete search history.

(56) References Cited

U.S. PATENT DOCUMENTS 5,317,537 A * 5/1994 Shinagawa et al. ..... 365/189.04
5,619,456 A * 4/1997 McClure ................. 365/189.17
7,075,842 B2 * 7/2006 Tzartzanis et al. ....... 365/185.2

FOREIGN PATENT DOCUMENTS

JP   2001-291389   10/2001

\* cited by examiner

*Primary Examiner*—Tan T. Nguyen
(74) *Attorney, Agent, or Firm*—Rader, Fishman & Grauer PLLC; Ronald P. Kananen

(57) ABSTRACT

Disclosed herein is a semiconductor memory device including, a memory array with memory cells array-like arranged, a read bit line connected to a data output node of the memory cells and shared by a plurality of the memory cells arranged in one direction in the memory array, a write bit line connected to a data input node of the memory cells and shared by a plurality of the memory cells, a sense amplifier for sensing a voltage of the reading bit line, a first sense line and a second sense line connected to the sense amplifier, a read bit line switch for controlling electrical connection and disconnection between the first sense line and the read bit line, a write buffer connected between the second sense line and the write bit line, capable of controlling electrical connection and disconnection between the second sense line and the write bit line.

10 Claims, 26 Drawing Sheets

FIG.16
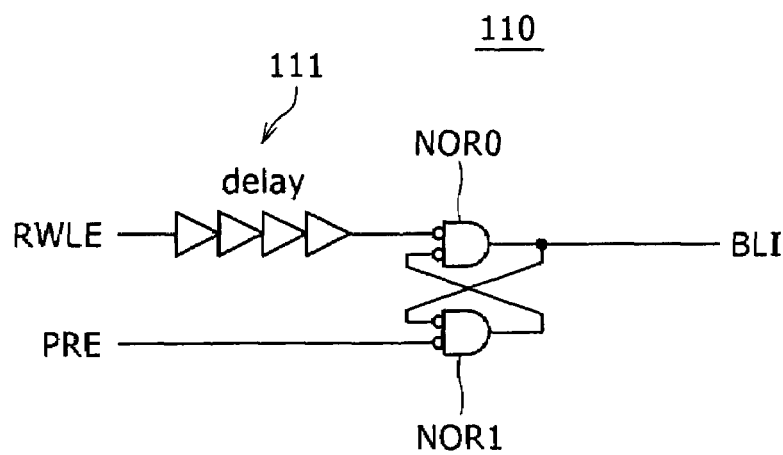
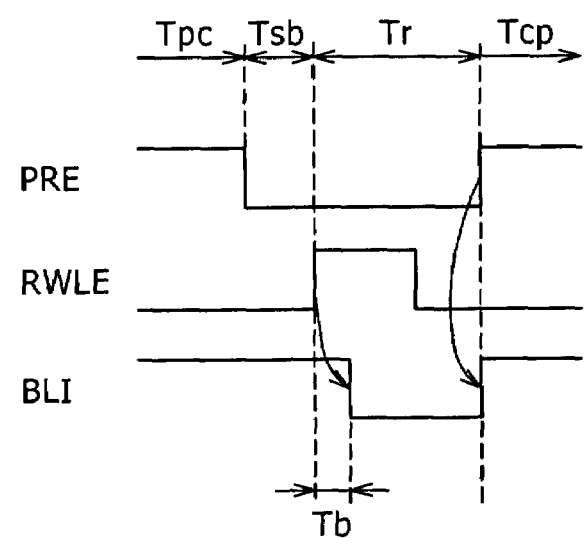
FIG.17A  PRE
FIG.17B  RWLE
FIG.17C  BLI

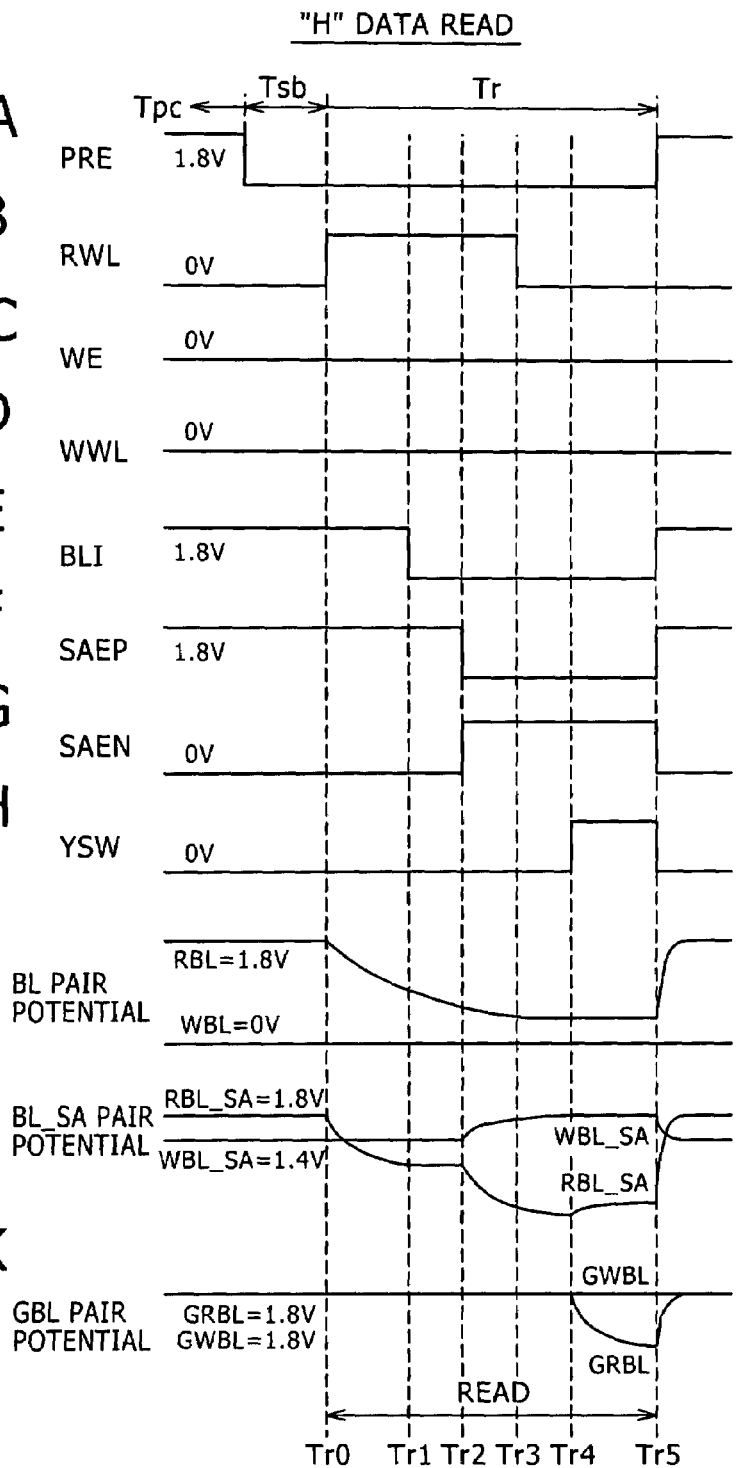

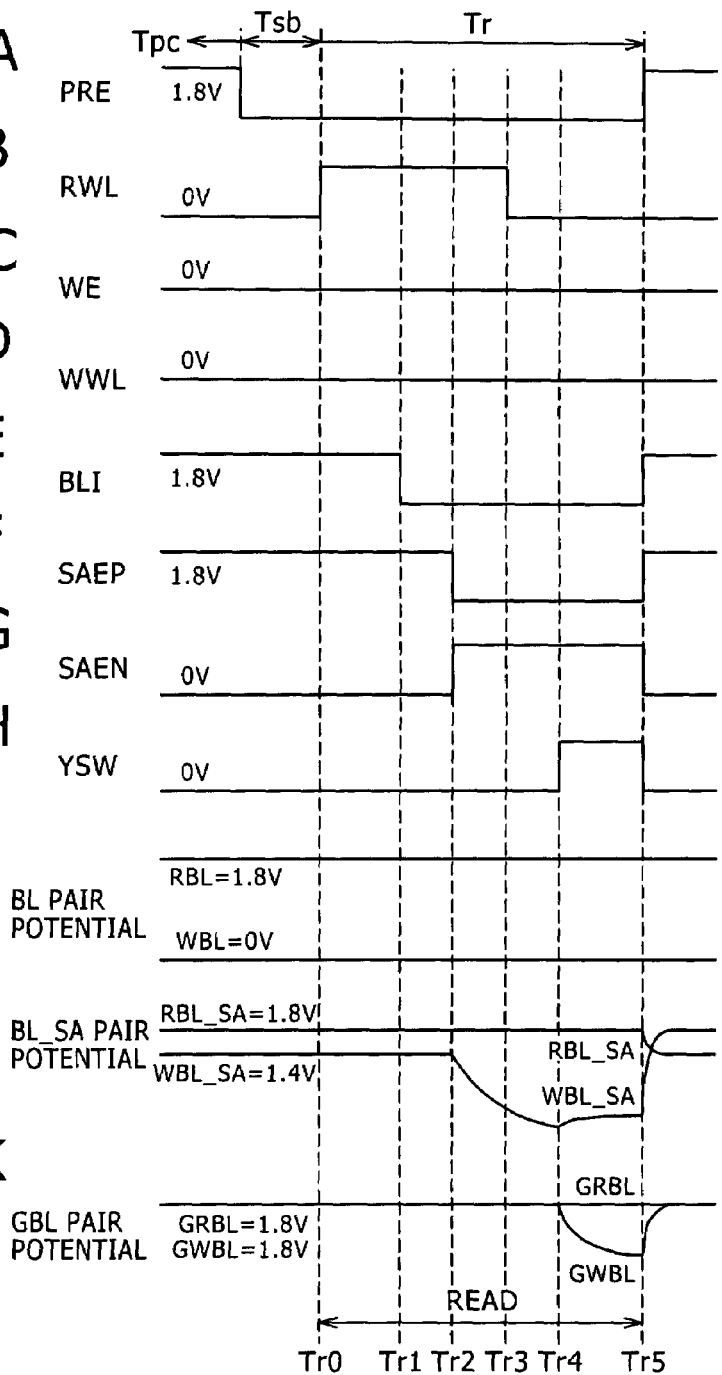

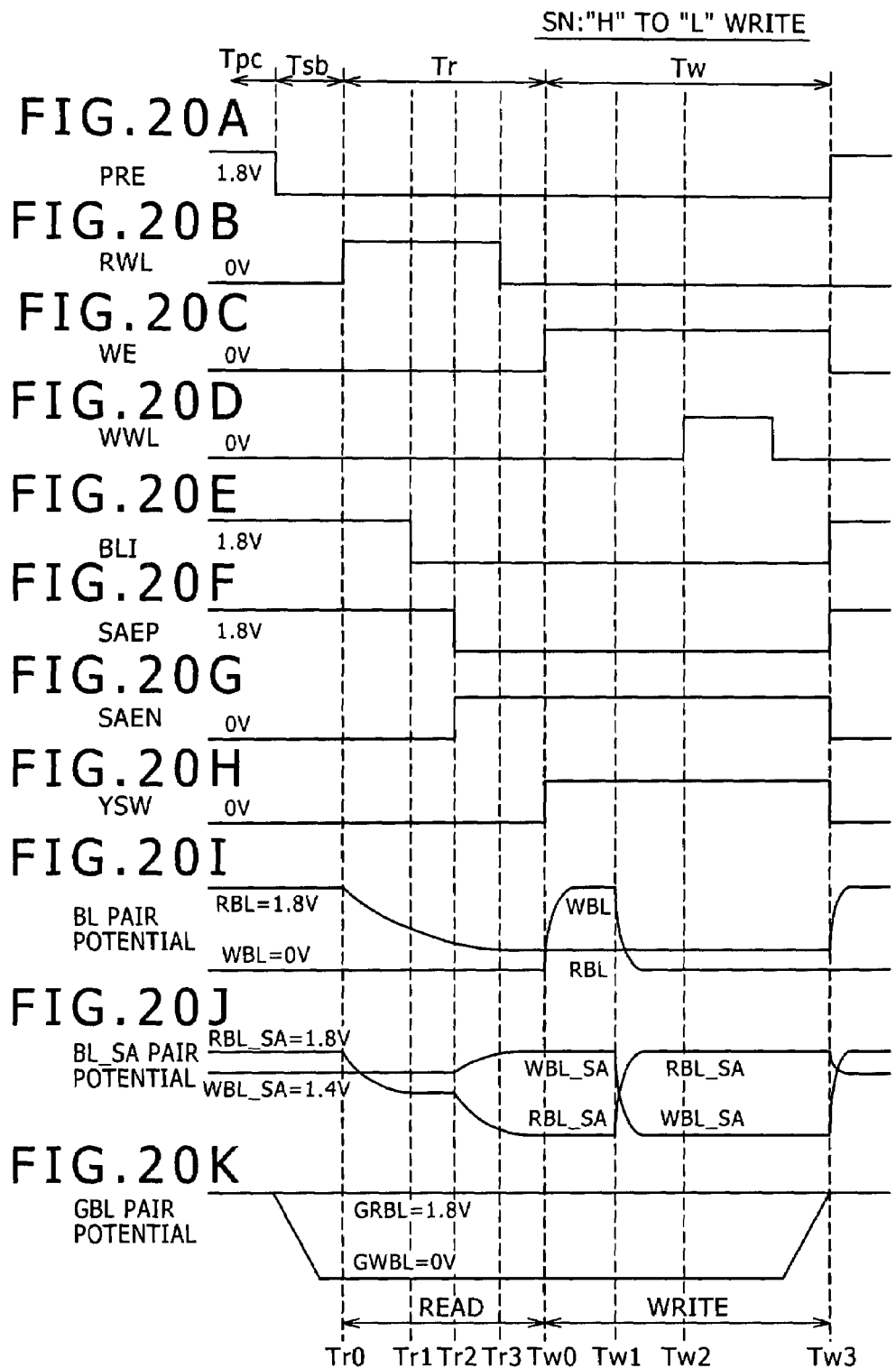

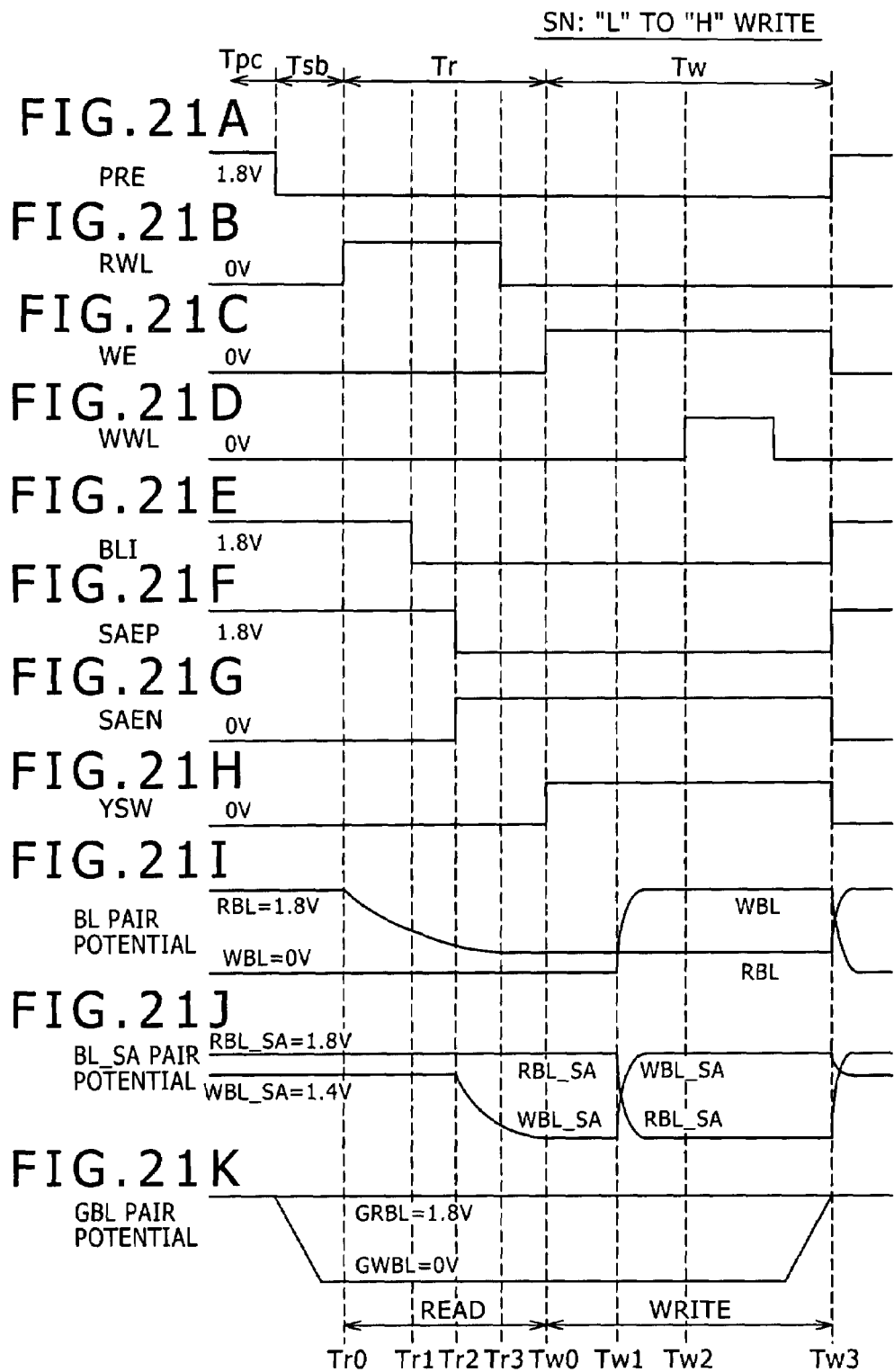

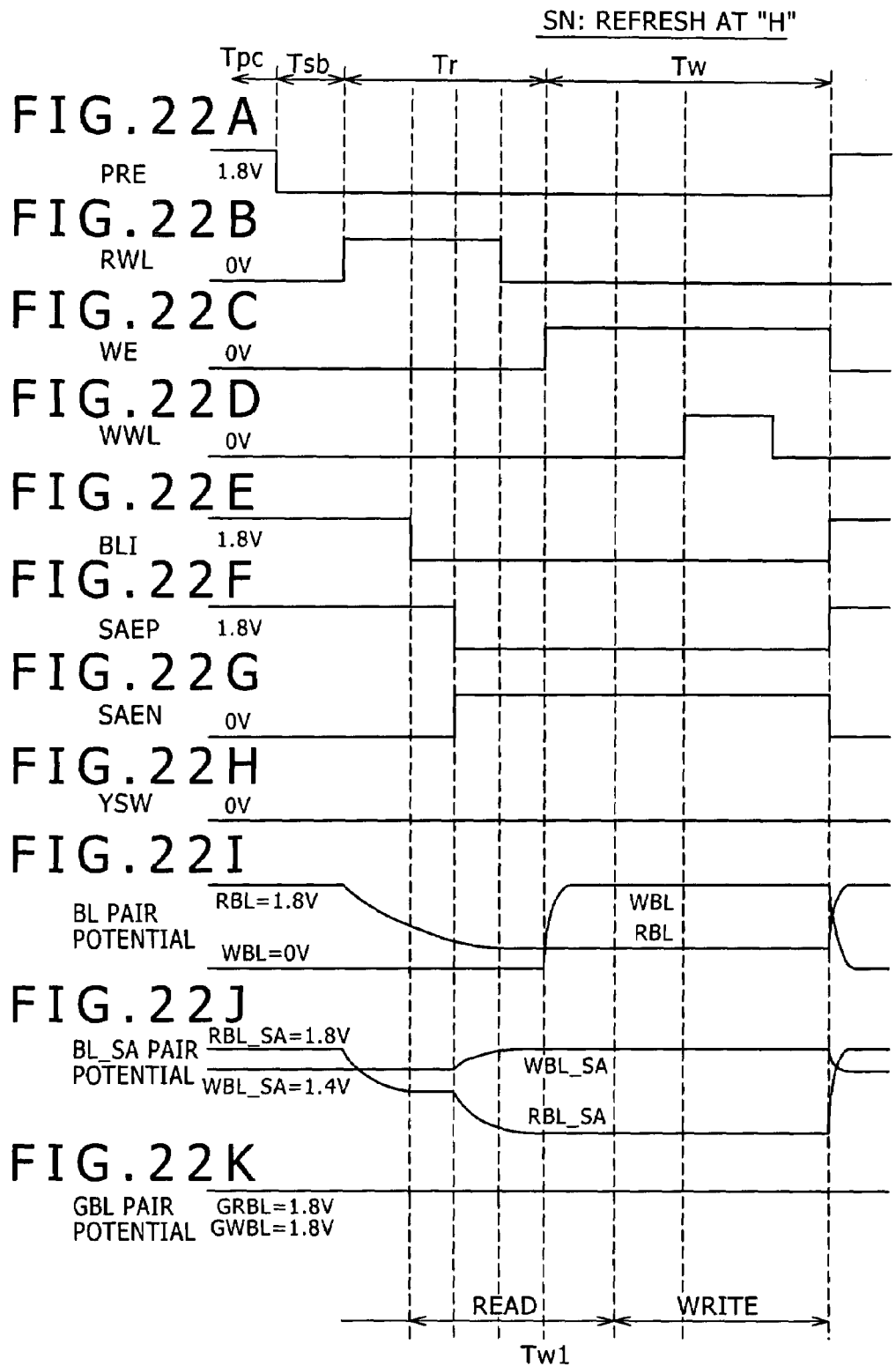

SN: REFRESH AT "L"
FIG.23A PRE 1.8V
FIG.23B RWL 0V
FIG.23C WE 0V
FIG.23D WWL 0V
FIG.23E BLI 1.8V
FIG.23F SAEP 1.8V
FIG.23G SAEN 0V
FIG.23H YSW 0V
FIG.23I BL PAIR POTENTIAL RBL=1.8V WBL=0V
FIG.23J BL_SA PAIR POTENTIAL RBL_SA=1.8V WBL_SA=1.4V
FIG.23K GBL PAIR POTENTIAL GRBL=1.8V GWBL=1.8V
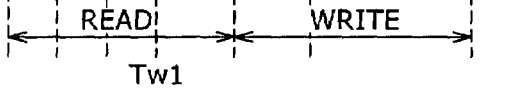

SEMICONDUCTOR MEMORY DEVICE

CROSS REFERENCES TO RELATED APPLICATIONS

The present invention contains subject matter related to Japanese Patent Application JP 2006-204800 filed in the Japan Patent Office on Jul. 27, 2006, the entire contents of which being incorporated herein by reference.

BACKGROUND OF THE INVENTION

1. Field of the Invention

The present invention relates to a semiconductor memory device having a memory cell with a read bit line connected to a data output node thereof and also with a write bit line connected to a data input node thereof and enabling operations for reading and writing data via the pair of bit lines.

2. Description of the Related Art

There has been known the so-called gain cell as a memory cell with the data input node connected to a write bit line and the data output node connected to a read bit line.

In the gain cell, there is provided an amplifier transistor that stores an electric charge in the so-called capacitive component added to a gate for data storage, and the data stored in the memory cell is read out by checking a voltage change in the read bit line in response to whether the amplifier transistor is turned ON or not when reading out the data.

FIG. 1 illustrates an equalizing circuit constituting a three-transistor type gain cell (hereinafter simply referred to as a memory cell).

The memory cell MCa shown in FIG. 1 includes one write transistor WT and two read transistors, namely a select transistor ST and an amplifier transistor AT.

Either source or drain region of the write transistor WT is connected to a write bit line WBL, the other region is connected to a storage node SN, and a gate is connected to a write word line WWL.

A source of the amplifier transistor AT is connected to the ground level voltage (a common source line CSL), a drain is connected to a source of the select transistor ST, and a gate is connected to a storage node SN.

A drain of the select transistor ST is connected to a read bit line RBL, and a gate is connected to a read word line RWL.

FIG. 2 illustrates an example of a memory cell control circuit.

As shown in FIG. 2, a plurality of the memory cell MCa each having the configuration, as shown in FIG. 1, is arrayed along the column direction. The memory cells MCa share the read bit line RBL and the write bit line WBL, namely a bit line pair.

Connected to the bit line pair is a precharge circuit 50 including two precharge transistors including two precharge transistors PTr and PTw each including a PMOS transistor. The precharge transistor PTr has a source and a drain, one of which is connected to the read bit line RBL and the other is connected to a voltage supply line of a voltage VRBL. The precharge transistor PTw has a source and a drain, one of which is connected to the write bit line WBL and the other is connected to a voltage supply line of a VWBL. The two precharge transistors PTr and PTw are controlled commonly by a precharge enable signal PRE.

A cross-coupled latch type sense amplifier (hereinafter referred to as sense amplifier) SA is connected to the read bit line RBL and the write bit line WBL.

In the sense amplifier SA, as illustrated in FIG. 2, an input terminal and an output terminal of the inverter including a PMOS transistor 21 and a NMOS transistor 22 respectively are cross-connected.

Between a shared source for the two of the transistors 21 and the voltage line, a PMOS transistor 23 controlled by a low-active SA enable inversion signal (or SAEP) is connected. Between a shared source for the two of the NMOS transistors 22 and the grounded connection, an NMOS transistor 24 controlled by a high-active SA enable signal (or /SAEN) is connected. The two AS enable signals (SAEN and /SAEP) are shared by other sense amplifiers arrayed in a direction of rows (not shown).

The memory cell control circuit using the cross-coupled latch type sense amplifier SA is described, for instance, in Japanese Patent Laid-Open NO. 2001-291389 (hereinafter referred to as Patent document 1).

A BL selector 6B is provided as a circuit for electrically disconnecting the read bit line RBL and write bit line WBL that connect to the precharge circuit 50 and the sense amplifier SA from other control circuits.

The BL selector 6B includes an NMOS switch 61r connected to both of the read bit lines RBL and a global read bit line GRBL, and an NMOS switch 61w connected to both of the write bit lines WBL and a global write bit line GWBL.

FIGS. 3A to 3G are timing charts for illustrating an operation for reading "L" data read from the storage node SN. As shown in FIG. 3C, the write word line WWL is always kept in the inactive state (at "L" level) during the read operation.

During an interval to the time point T0 shown in FIG. 3A, because the low-active precharge enable signal PRE is at the "L" level, both of the precharge transistors PTr and PTw are in the ON state. Thus, the voltage VRBL (voltage Vdd=1.8 V, for example) is precharged in the read bit line RBL, while a voltage VWBL (1.4 V, for example) which is lower than the voltage VRBL is precharged. At the time point T0, the precharge enable signal PRE is set in the inactive state (to the "H" level), and thus the bit lines RBL and WBL operate in the floating state while the precharged voltage is maintained.

As shown in FIG. 3B, at the time point T1, an "H" level pulse, for instance, the power supply voltage Vdd is applied to the read word line RWL. Thus, though the select transistor ST can be turned ON, the amplifier transistor AT is maintained in the OFF state because the voltage of the storage node SN is at the "L" level. Therefore, the voltage of the read bit line RBL is kept at the power supply voltage Vdd (1.8 V).

As shown in FIGS. 3D and 3E, at the time point T2, the SA enable signal SAEN is activated to the "H" level and the SA enable inversion signal SAEP is activated to the "L" level. With the operation, the cross-coupled latch type sense amplifier SA operates and amplifies a fine potential difference (about 0.4 V) between a voltage in the read bit line RBL and that in the write bit line WBL to a signal at the voltage 1.8 V. The signal generated when the voltage of the read bit line RBL is higher than the voltage of the write bit line WBL corresponds to an "L" data stored in the memory cell MCa.

Then, the Y switch signal YSW shown in FIG. 3F is set to the "H" level for activating the NMOS switch pair 61r and 61w constituting the BL selector 6B shown in FIG. 2 the ON state, and the read-out "L" data is transferred to a successive circuit.

FIG. 4A to FIG. 4G are timing charts each illustrating an operation for reading "H" data from the storage node SN.

The voltage level control for the operation (shown in FIG. 4A to FIG. 4F) is the same as that in the "L" data read operation described above, except that the data stored in the storage node SN is at the "H" level.

During the "H" data read operation, the data stored in the storage node SN is set at a higher voltage than a threshold voltage that enables the amplifier transistor AT shown in FIG. 1 to be activated into the ON state, and the voltage is maintained during the read operation.

Therefore, at the time point T1 shown in FIG. 4B, the read word line RWL is activated causing the select transistor ST to be activated into the ON state, and a voltage is applied to a section between the amplifier transistor AT source and the drain, and thus the transistor AT is activated into an ON state. Therefore, the voltage of the read bit line RBL is discharged, via the select transistor ST and the amplifier transistor AT, to a common source line CSL. Then, as shown in FIG. 4G, a voltage inversion is generated, enabling the voltage of the read bit line RBL which is lower than the voltage of the write bit line WBL.

As shown in FIG. 4D and FIG. 4E, when the sense amplifier is activated at the time point T2, the sense amplifier SA amplifies the potential difference between the read bit line RBL and the write bit line WBL after occurrence of the voltage inversion described above into the signal having the voltage of 1.8 V. The signal generated when the voltage of the read bit line RBL is lower than the voltage of the write bit line WBL corresponding to the "H" data stored in the memory cell MCa.

Then the Y switch signal YSW is set at the "H" level, as shown in FIG. 4F, with the BL selector 6B shown in FIG. 2 activated, and the read "H" data is transferred to a successive circuit.

FIG. 5A to FIG. 5I are timing charts for illustrating an operation for writing the "L" data to the storage node SN. FIG. 6A to FIG. 6I are timing charts for illustrating an operation for writing the "H" data to the storage node SN.

In both of the operations shown in FIG. 5 and FIG. 6, it is necessary to set a voltage enabling the read operation and the refresh operation to the write bit line WBL, before the activation of the word line WWL (or before to time T4). The reasons are described below.

FIG. 2 is a view illustrating a configuration including an array of memory cells and a control circuit (hereinafter referred to as a column unit). It is to be noted that, in an actual semiconductor memory device, a plurality of the same configurations is repetitively arranged along the row direction. The memory cells in each line share the write word line WWL and the read word line RWL.

An operation for writing data by the prespecified number of bits, for instance, by 1 byte (8 bits) is necessary in each line to enable a random access by the device. For the purpose, write data is set from a write circuit not shown in the global write bit line GWBL in the column unit as a target for the write operation and the Y switch signal YSW is activated to forcefully update a potential in the write bit line WBL with the write data. In a column unit not selected as a target for the write operation, a refresh operation is performed. Specifically, after the read operation for reading the data stored in the memory cell to the read bit line RBL is performed, logic of the cell store data are inverted from that of the read data (Refer to FIG. 3G and FIG. 4G). By the read operation, the cell-stored data having a maximum voltage (=1.8 V) is set in the write bit line WBL (Refer to FIG. 3G and FIG. 4G). The column unit is controlled so that the Y switch signal YSW does not activate. Thus, the refresh operation is enabled by the successive activation of the word line WWL.

As described above, in the semiconductor memory in the past providing controls as described above, it is necessary to set a voltage enabling an operation for rewriting data in the write bit line WBL by performing a data read operation before a data write operation.

Until the time point T3 shown in FIG. 5 and FIG. 6, the read operation as described by referring FIG. 3 and FIG. 4 is performed, and description of the operation is omitted herein.

However, voltage of write data in the operation for writing "L" data (FIG. 5) is inverted from that in the operation for writing "H" data (FIG. 6), and, therefore, a voltage in the global read bit line GRBL (in FIG. 5) is inverted from that in the global write bit line GWBL (in FIG. 6).

More specifically, when writing "L" data, as shown in FIG. 5H, a voltage at a high level (1.8 V) is set in the global read bit line GRBL, and a voltage at a low level (0 V) is set in the global write bit line GWBL.

In contrast, when writing "H" data, a voltage at a low level (0 V) is set in the global read bit line GRBL, as shown in FIG. 6H, and a voltage at a high level (1.8 V) is set in the global write bite line GWBL.

After completion of the read operation, the Y switch signal YSW shown in FIG. 2 is activated. Then, voltages in the bit line pair (read bit line RBL and the write bit line WBL) are inverted in both column units including a cell as a target for "L" data write and other column units including a cell as a target for "H" data write in FIG. 5 and FIG. 6, respectively. To describe the operation from a contrary point of view, a voltage (a write voltage) in the global write bit line GWBL or the like is set so that the inversion occurs for the target cell for data write operation.

On the other hand, in a column unit including a cell not selected as a target for the data write operation and not shown in FIG. 5, the Y switch signal YSW does not shift to the "H" level, the bit line pair preserved the state just before the time point T3 even after the time point T3.

Next, as shown in FIG. 5C and FIG. 6C, the write word line WWL is set to a high level at the time point T4. With this operation, the write transistor WT shown in FIG. 1 is turned ON, and write data forcefully set in the write bit line WBL is written in the storage node SN.

As described above, in the column unit not selected according to the Y switch signal YSW, the storage node voltage previously written therein is amplified and the data is read into the write bit line WBL. Therefore, when the write word line WWL is activated, the data read out, as described above, is again written in the storage node SN of the not-selected memory cell, thus a refresh operation is carried out.

After the data write operation is performed, a voltage in the write word line WWL is dropped to a low level (0 V) as shown in FIG. 7, and the write transistor WT is turned OFF. In this step, a voltage in the read word line RWL is kept at 0 V, and the OFF state of the select transistor ST is maintained until a data read operation is performed next. In this standby state, the storage node SN floats, and the accumulated charge is preserved.

The accumulated charge is accumulated mainly in a capacitance between a source side dispersion layer of the transistor WT and a substrate, in a capacitance between the source side dispersion layer and a gate of the write transistor WT, and in a MOS gate capacitance (including parasitic capacitance) of the amplifier transistor AT. Therefore, a voltage in the storage node SN attenuates due to a dispersion layer junction leak in the write transistor WT, a gate leak in the amplifier transistor AT and the like. To prevent the attenuation, it is necessary to perform data rewrite (refreshing) each time a prespecified period of time passes after completion of the write operation. In the configuration as described above, the refreshing operation can be carried out when writing data any other memory cell connected to the same row.

SUMMARY OF THE INVENTION

As described above, when read operation is performed with the cross coupled latch-type sense amplifier SA, a bit pair line of voltages are required to reverse at reading one of "H" data and "L" data.

However, the parasitic resistances and capacity loads of the read line RBL and the write bit line WBL increases with an increase of a memory size.

Accordingly, a considerable time is required from a time T1 in FIG. 4 which actually begins reading to a time T2 at which the bit line pair is reversed and then the sufficient potential difference between the bit line pair is obtained, which prevents the speed up of the read operation.

In the reverse operation which the cross coupled latch-type sense amplifier SA performs, a period for which the read bit line RBL and the write bit line WBL are in intermediate potential is longer than periods of the low-level and the high-level potentials. As a result, a large through current flows into a CMOS inverter (including a PMOS transistor 21 and the NMOS transistor 22) constituting the sense amplifier SA in FIG. 2, which prevents reduction of the power consumption.

Furthermore, the read bit line RBL and write bit line WBL with large loads require a large charge and discharge current, which prevents reduction of the power consumption.

On the other hand, when write operation is performed with the cross coupled latch-type sense amplifier SA, a bit pair line of voltages are required to reverse at writing.

In the reverse operation, a considerable time is required, because of the increase of the parasitic resistance and the capacity load of the bit pair line, from a time T3 in FIGS. 5 and 6 at which a voltage reversal begins in the read bit line RBL and the write bit line WBL to a time T4 at which actual write is enabled, which prevents reduction of the write operation time.

The write operation requires a read operation in advance, and the read operation requires waiting for the time in which the voltages of the bit line pair are reversed and then the sufficient potential difference between the bit line pair is obtained. Thus, a write cycle time is longer.

The reverse operation at writing is forcibly performed by write data provided from the outside. During the time T3 in FIGS. 5 and 6 at which the reverse operation begins, the period for which the read bit line RBL and the write bit line WBL are the intermediate potential is long, because, in the time T2 before the time T3, the sense amplifier SA is activated. As a result, the large through current flows into the CMOS inverter constituting the sense amplifier SA in FIG. 2, which prevents reduction of power consumption.

Furthermore, the read bit line RBL and write bit line WBL with large loads require a large charge and discharge current, which prevents reduction of the power consumption. Moreover, the write operation requires a voltage amplification of the read bit line RBL not directly connected to a storage node, which consumes no small current when swinging the voltage of the read bit line RBL and then prevents reduction of the power consumption.

In the field of a single transistor-single capacitor (1T1C) type DRAM cell, it is known that a transistor is provided for separating the bit line and the sense amplifier SA in the configuration (For instance, Japanese Patent Laid-Open No. 2005-145931).

However, the configuration intends to speed up the sense operation and the bit line pair amplifies the differential potential between 0 V and the power supply voltage Vdd for re-write to the DRAM cell. For the features, a large charge and discharge current is required for the bit line pair activated when performing the read operation and the write operation, which prevents reduction of the power consumption.

Problems to be solved by the present invention are solved by the speedup of read and write operations and the reduction of the power consumption in the semiconductor memory device having memory cells performing the data input (write) and data output (read) at different nodes.

The semiconductor memory device according to the present invention includes a memory array with memory cells array-like arranged, a read bit line connected to a data output node of the memory cells and shared by a plurality of the memory cells arranged in one direction in the memory array, a write bit line connected to a data input node of the memory cells and shared by a plurality of the memory cells, a sense amplifier for sensing a voltage of the reading bit line, a first sense line and a second sense line connected to the sense amplifier, a read bit line switch for controlling the electrical connection and disconnection between the first sense line and the read bit line, a write buffer connected between the second sense line and the write bit line, capable of controlling the electrical connection and disconnection between the second sense line and the write bit line.

In the present invention, the write buffer is a three-state buffer having three states including a first output state for outputting a high-level voltage for electrically connecting between an input and an output to write back data to the memory cells, a second output state for outputting a low-level voltage for electrically connecting between the input and the output to write back data to the memory cells, and an electrical disconnection state between the input and the output.

In the present invention, a bit control circuit and a write control circuit are provided and a signal for controlling the read bit line switch is supplied from the bit line switch control circuit and a signal for controlling the write buffer is supplied from the write control circuit.

In the present invention, a bit control circuit and a writing control circuit are provided and a signal for controlling the read bit line switch is supplied from the bit line switch control circuit, and a signal for controlling the write buffer is shared with a signal outputted from the read control circuit for controlling the sense amplifier.

The sense amplifier is a cross coupled latch type sense amplifier that is connected between a high-level of power supply voltage and a low level of power supply voltage and senses a differential voltage between voltages of the first sense line and the second sense line and then amplifies the high-level power supply voltage and the low level power supply voltage.

Or, the sense amplifier is a single-ended sense amplifier that has an inverter of which a threshold is a reference voltage.

Or, the sense amplifier is a single-ended sense amplifier where a threshold of an inside NMOS transistor is a reference voltage.

In the present invention, when the write buffer controls electrical disconnection between the writing bit line and the second sense line, the second sense line is connected to a reset switch for applying a constant voltage to the second sense line.

The present invention enables the speedup of read and write operations and the reduction of the power consumption in the semiconductor memory device having memory cells performing the data input (write) and data output (read) at different nodes.

BRIEF DESCRIPTION OF THE DRAWINGS

FIG. 16 is a circuit diagram illustrating a BLI driver;

FIG. 17A to FIG. 17C are timing charts for control of a bit line isolation signal;

FIG. 18A to FIG. 18K are timing charts for reading out "H" data in the embodiment;

FIG. 19A to FIG. 19K are timing charts for reading out "L" data in the embodiment;

FIG. 20A to FIG. 20K are timing charts for reading out "L" data in the embodiment;

FIG. 21A to FIG. 21K are timing charts for reading out "H" data in the embodiment;

FIG. 22A to FIG. 22K are timing charts for refreshing "H" data in the embodiment;

FIG. 23A to FIG. 23K are timing charts for refreshing "L" data in the embodiment;

DETAILED DESCRIPTION OF THE PREFERRED EMBODIMENTS

An example of a semiconductor memory device according to an embodiment of the present invention is described below with reference to the related drawings.

<General Configuration>

Figure 8:
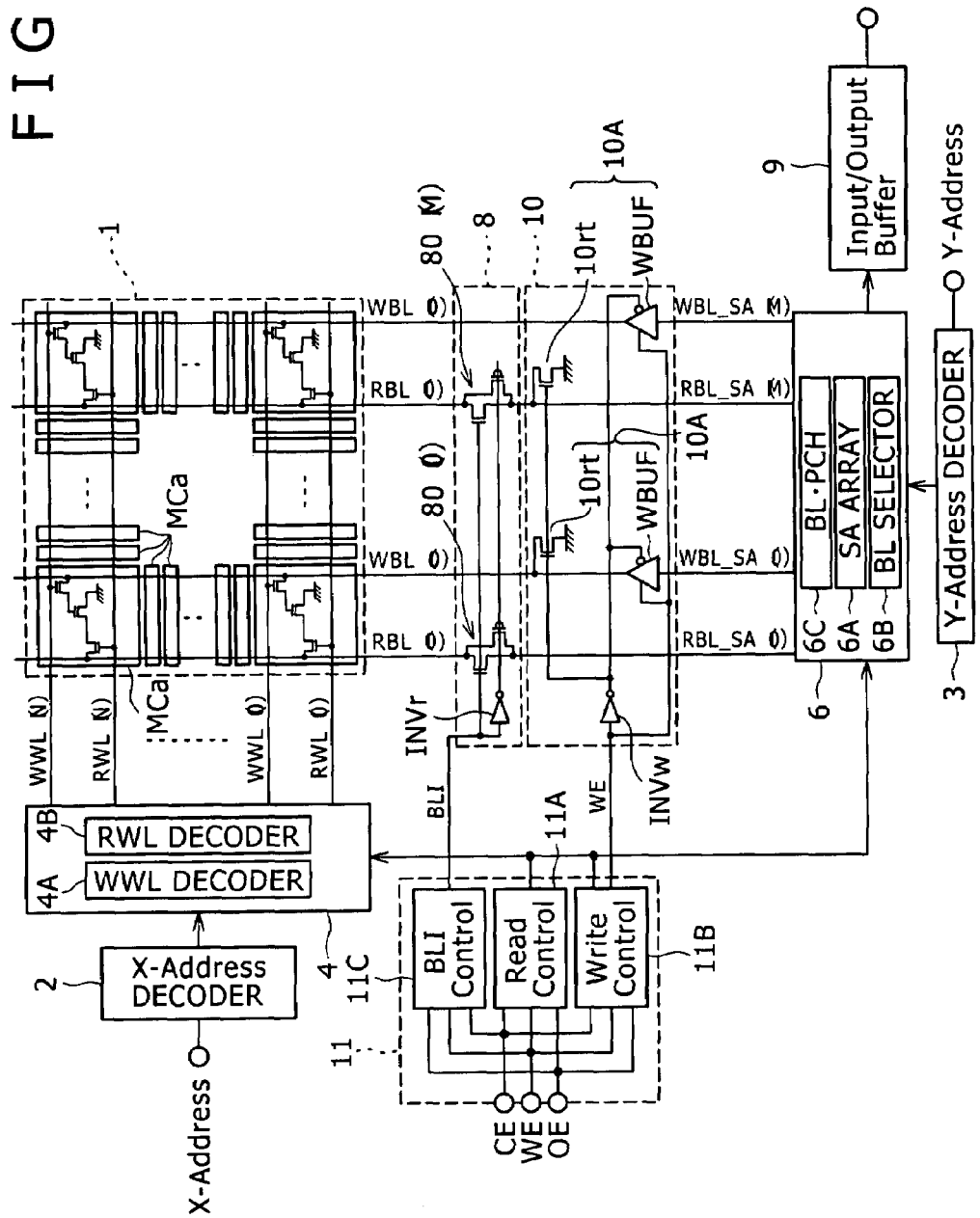
FIG. 8 is a general block diagram illustrating a semiconductor memory device according to the embodiment of the present invention.

FIG. 8 is a general block diagram illustrating a semiconductor memory device.

Figure 1:
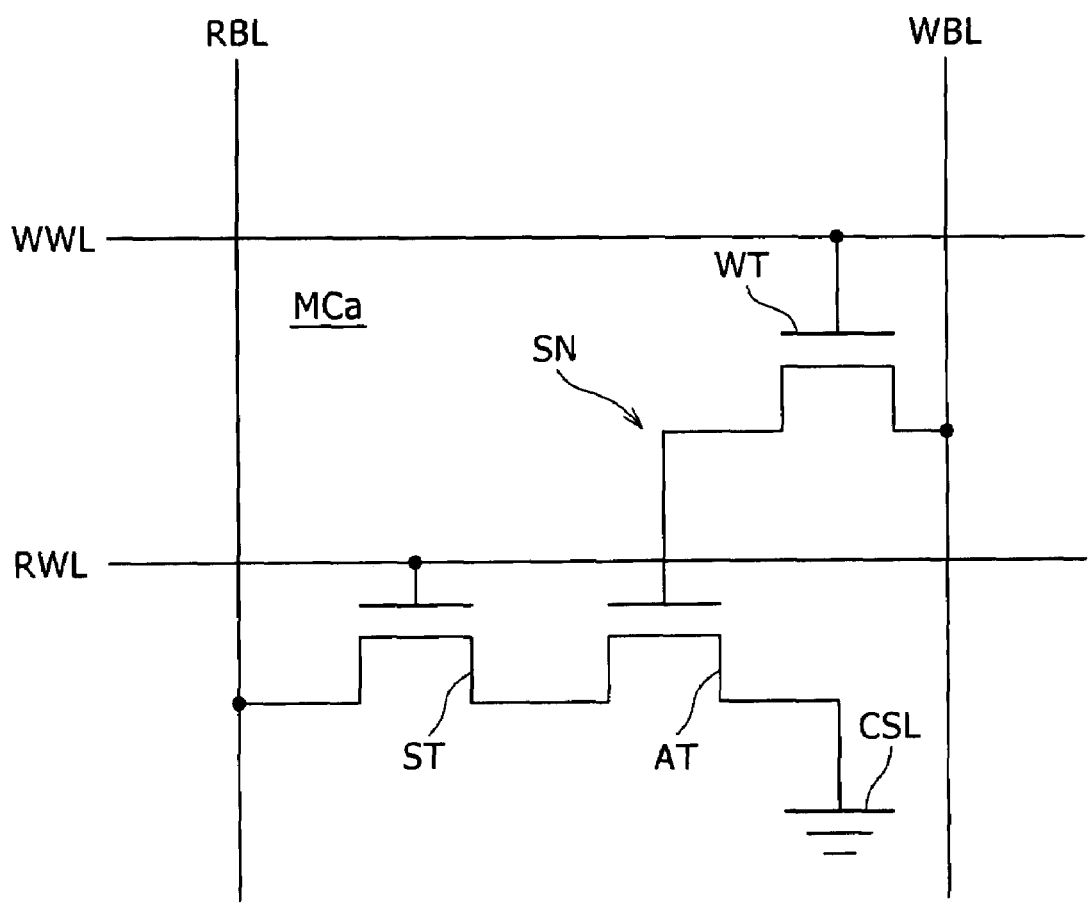
FIG. 1 is an equalizing circuit of a 3T type gain cell based on the background technology as well as to an embodiment of the present invention.
Figure 2:
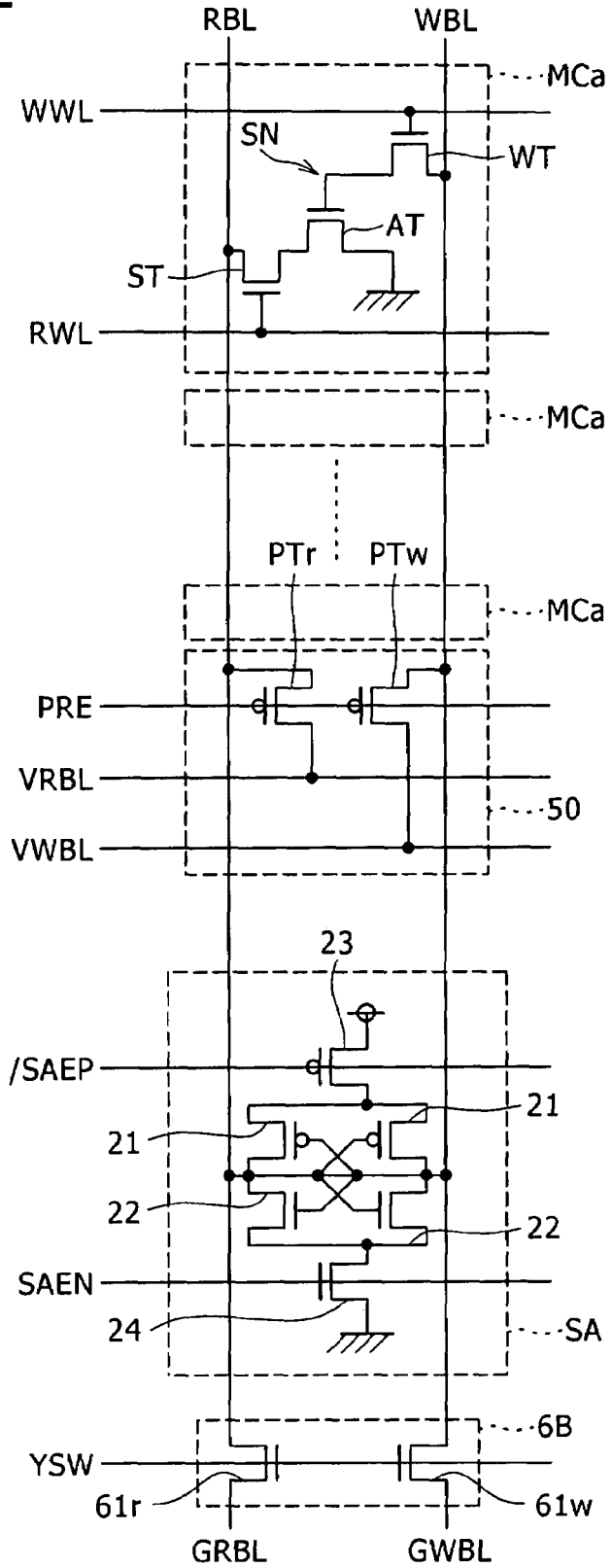
FIG. 2 is a circuit diagram illustrating a circuit including a memory cell control system circuit based on the background technology.

The semiconductor memory device shown in FIG. 8 has a memory cell array 1 having a number of memory cells MCa shown in FIG. 1 arranged in a matrix form and a peripheral circuit for the memory cell array 1.

The peripheral circuit includes an X-address decoder 2, a Y-address decoder 3, a row decoder 4, a column circuit 6, a BLI (Bit Line Isolation circuit) 8, an input/output (I/O) buffer 9, a WBL connection control circuit 10, and a control circuit 11.

One of the features of the semiconductor memory device is that the device has the BLI circuit 8 and the WBL connection control circuit 10. Details of the BLI circuit 8 and the WBL connection control circuit 10 are described hereinafter.

The X-address decoder 2 is a circuit for decoding an inputted X-address signal and sending the decoded signal to the row decoder 4.

The Y-address decoder 3 is a circuit for decoding an inputted Y-address signal and sending the decoded signal to the column circuit 6.

The row decoder 4 has a WWL decoder 4A for selecting a write word line WWL and applying a prespecified voltage to the selected write word line WWL, and an RWL decoder 4B for selecting a read word line RWL and applying a prespecified voltage to the selected read word line RWL.

The column circuit 6 has an array 6A of cross-coupled latch type sense amplifiers (described simply as sense amplifier SA hereinafter), a BL selector 6B for selecting a pair of bit lines RBL and WBL based on a result of decoding by the Y-address decoder 3, and a precharge circuit (BL.PCH) 6C for the bit line BL (a sense line to described more accurately).

The control circuit 11 has three control circuits receiving a chip enable signal CE, a write enable signal WE, and an output (read-out) enable signal OE and operating based on the three types of enable signals respectively. The three control circuits are a read control circuit 11A for controlling the row decoder 4 and the column circuit 6 when reading data, a write control circuit 11B for controlling the row decoder 4, the column circuit 6, and the WBL connection control circuit 10 when reading and writing data, and a BLI control circuit 11C for controlling the BLI circuit 8. The BLI control circuit 11C corresponds to the "bit line switch control circuit) according to an embodiment of the present invention.

In the memory cell array 1, each memory cell MCa is connected to a word line pair consisting of the write word line WWL and the read word line RWL and to a bit line pair RBL, WBL.

There are provided (N+1) write word lines WWL(0) to WWL(N) in all, and also, there are provided (N+1) read word line RWL(0) to RWL(N).

Furthermore, there are provided (M+1) write bit lines WBL(0) to WBL(M) in all, and also, there are provided (M+1) read bit lines RBL(0) to RBL(M) in all.

In addition, as local bit lines connected to the SA array 6A in the column circuit 6, there are provided sense lines for the read bit line RBL (described as RBL sense line hereinafter) RBL_AS(0) to RBL_SA(M), and sense lines for the write bit line WBL (described as WBL sense line hereinafter) WBL_SA(0) to WBL_SA(M). The RBL sense line RBL_SA corresponds to a "first sense line" according to an embodiment of the present invention, while the WBL sense line WBL_SA corresponds to a "second sense line" according to an embodiment of the present invention.

(2M+1) BL switches 80(0) to 80(M) provided for the read bit lines RBL(0) to RBL(M) are provided for each read bit line RBL in the BLI circuit 8, as shown in FIG. 8 and in the example shown in FIG. 8, and each of the BL switches 80(0) to 80(M) is a CMOS transfer gate in the example shown in FIG. 8.

Provided in the BLI circuit 8 is an inverter INVr for inverting a BL isolation signal BLI for controlling an NMOS transistor in the CMOS transfer gate for the purpose to control a PMOS transistor in the CMOS transfer gate.

Each of the BL switches 80(0) to 80(M) corresponds to a "bit line control switch" according to an embodiment of the present invention.

In FIG. 8, the BL switch 80(0) controls the connection between the read bit line RBL(0) and the RBL sense line RBL_SA(0). Similarly, the BL switch 80(M) controls the connection between the read bit line RBL(M) and the RBL sense line RBL_SA(M). Each of the 80(0) to 80(M) is controlled according to the BL isolation signal BLI. The BL isolation signal BLI is supplied from the BLI control circuit 11C.

The WBL connection control circuit 10 has the connection control sections 10A(0) to 10A(M) provided for each of the write bit lines WBL respectively, and an inverter INVw. A write enable signal WE is supplied from the write control circuit 11B to an input terminal of the inverter INVw, and the write enable signal WE and an output from the inverter INVw are provided as a common control signal to each of the connection control sections 10A(0) to 10A(M).

Each of the connection control sections 10A(0) to 10A(M) includes a write buffer WBUF, and a reset transistor 10*rt*. The write buffer WBUF in the connection control section 10A(0) is connected to a section between the WBL sense line WBL_SA(0) and the write bit line WBL(0), and the write buffer WBUF in the connection control section 10A(M) is connected to a section between the WBL sense line WBL_SA(M) and the write bit line WBL(M). The write enable signal WE can be inputted to a positive logic control input terminal of each write buffer WBUF, and an output signal from the inverter INVw can be inputted to a negative logic control input terminal.

Figure 9:
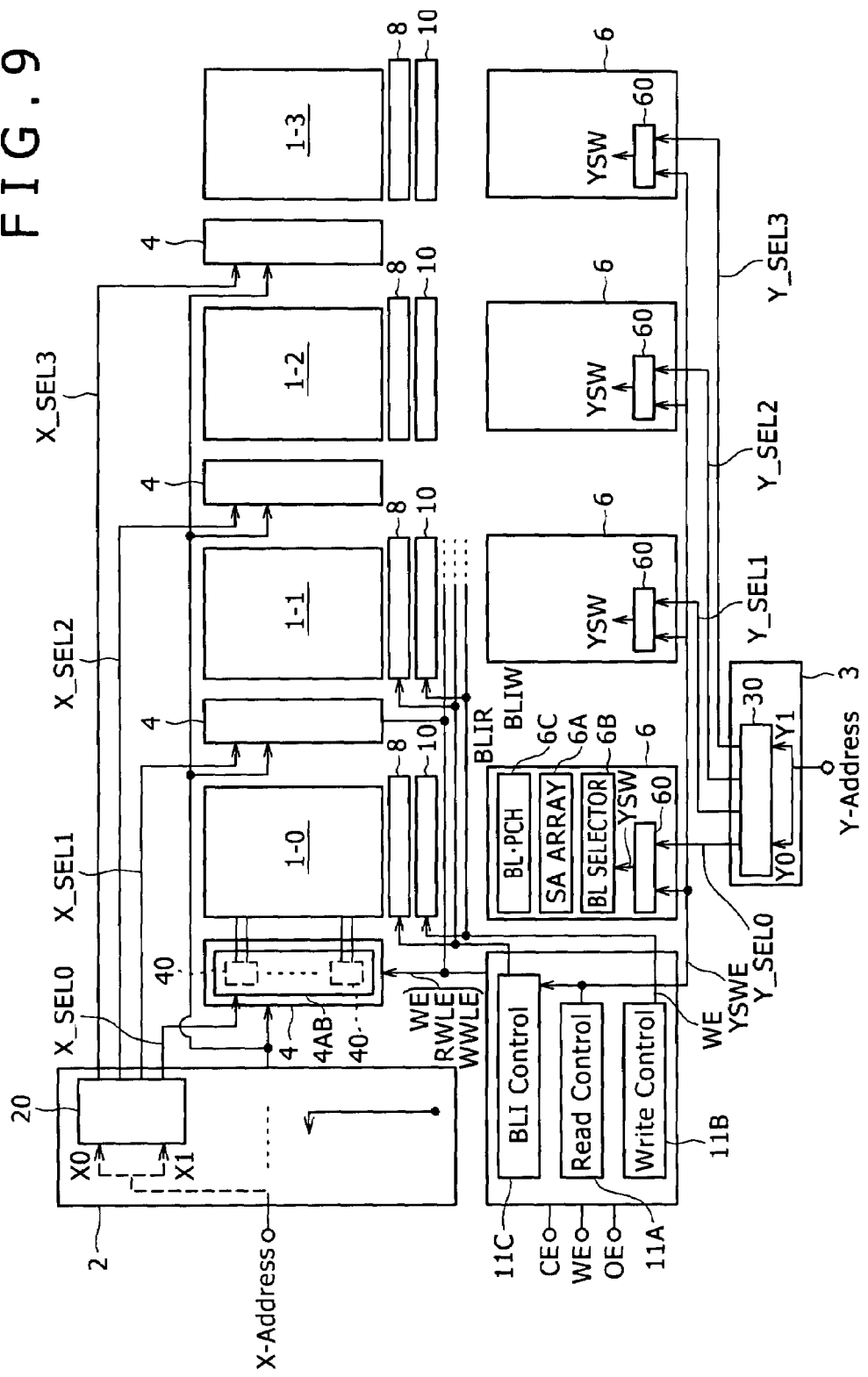
FIG. 9 is a block diagram illustrating the configuration shown in FIG. 8 in more detailed form.

FIG. 9 is a block diagram illustrating the configuration shown in FIG. 8 in further details.

The actual memory cell array 1 includes, as shown in FIG. 9, a plurality of (four) cell array blocks 1-0, 1-1, 1-2, and 1-3.

Provided in each of the cell array blocks 1-0, 1-1, 1-2, and 1-3 are the row decoder 4, the column circuit 6, the BLI circuit 8, and the WBL connection control circuit 10. Each of the row decoders 4 has a WWL decoder 4A and an RWL decoder 4B in FIG. 8, but has a word line decoder 4AB in which functions of the two decoders are combined in FIG. 9.

As a circuit for selecting any of the row decoders 4, there is provided an X selector 20 for decoding X address bits X0, X1 for block section in the X address decoder 2.

An X select signal X_SEL0 for selecting a cell array block 1-0, an X select signal X_SEL1 for selecting a cell array block 1-1, an X select signal X_SEL2 for selecting a cell array block 1-2, and an X select signal X_SEL3 for selecting a cell array block 1-3, are outputted from the X selector 20 to the row decoders 4 in the corresponding blocks respectively.

As a circuit for selecting any of the four column circuits 6, there is provided a Y selector 30 for decoding the Y address bits Y0, Y1 for block section in the Y-address decoder 3.

A Y select signal Y_SEL0 for selecting the column circuit 6 corresponding to the cell array block 1-0, a Y select signal Y_SEL1 for selecting the column circuit 6 corresponding to the cell array block 1-1, a Y select signal Y_SEL2 for selecting the column circuit 6 corresponding to the cell array block 1-2, and an Y select signal Y_SEL3 for selecting the column circuit 6 corresponding to the cell array block 1-3 are outputted from the Y selector 30 to the corresponding circuit 6.

In addition to the SA array 6A and the BL selector 6B, a YSW gate circuit 60 is provided in each column circuit 6.

The YSW gate circuit 60 is a circuit which receives a Y switch enable signal YSWE outputted from the write control circuit 11B in the control circuit 11 and any of the Y select signals Y_SEL0 to Y_SEL3 outputted from the Y selector 30 and generates a Y switch signal YSW to be outputted to the BL selector 6B based on the signals.

The BL isolation signal BLI can be outputted from the BLI control circuit 11C in the control circuit 11 to each of the four BLI circuits 8. From the write control circuit 11B in the control circuit 11, the write enable signal WE can be outputted to each of the four WBL connection control circuits 10. Furthermore, from the control circuit 11, the write enable signal WE, the RWL enable signal RWLE, and the WWL enable signal WWLE can be outputted to each of the row decoders 4.

<Memory Cell Control System Circuit>

Next, a configuration of the memory cell control system circuit connected to the bit line pair RBL, WBL is described below.

Figure 10:
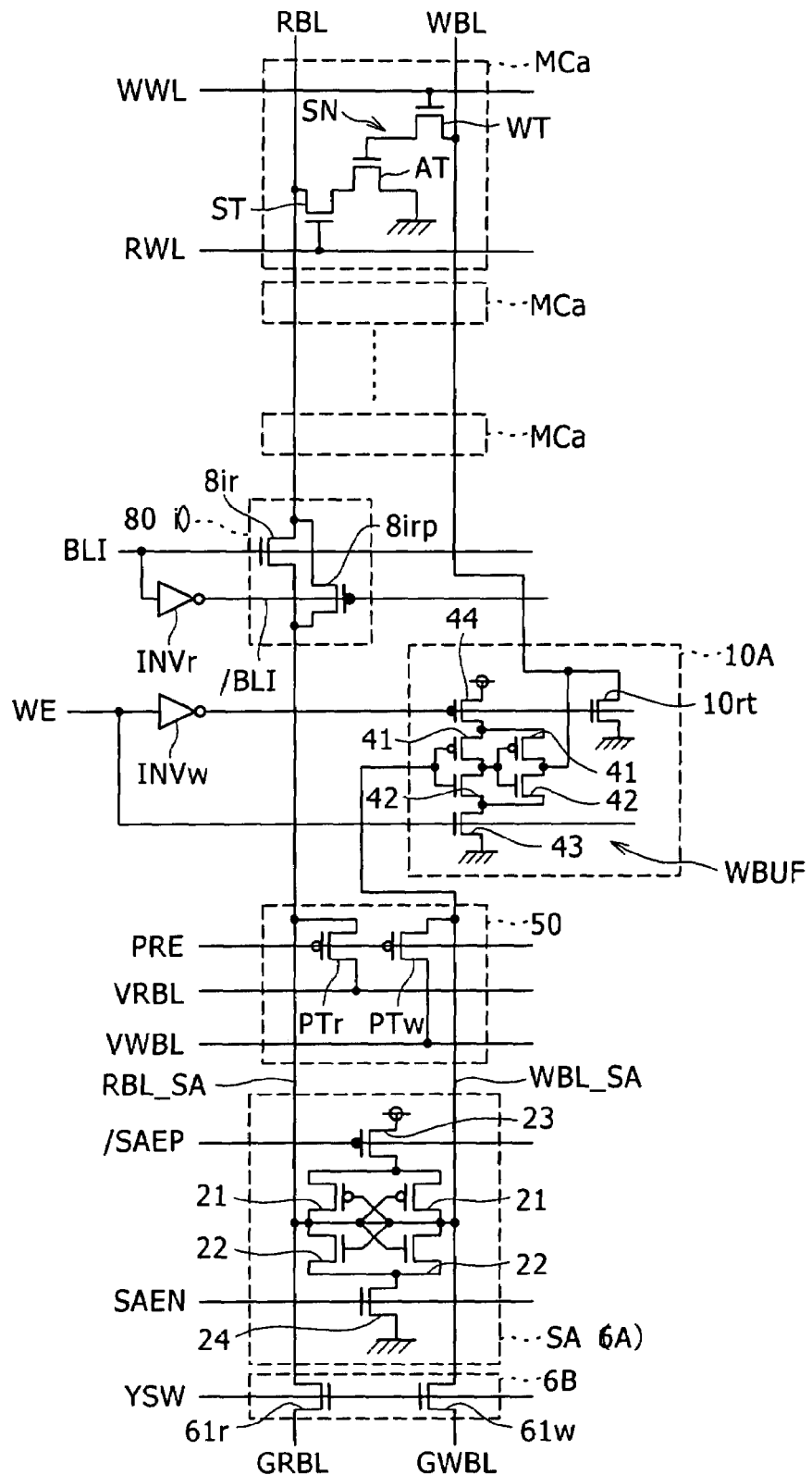
FIG. 10 is a circuit diagram illustrating a column unit.

FIG. 10 illustrates a circuit from the memory cell MCa connected to the bit line pair RBL, WBL up to the SA array 6A.

In FIG. 10, a plurality of memory cells MCa (N), each having the configuration shown in FIG. 1, are arranged along the column direction. The plurality of memory cells MCa share the read bit line RBL and the write bit line WBL (bit line pair RBL, WBL)

As described above with reference to FIG. 8, the BLI circuit 8 is provided in the read bit line RBL.

To describe in further details, a BL switch 8*ir* including an NMOS transistor and a BL switch 8*irp* including a PMOS transistor are connected to a section between the read bit line RBL and the RBL sense line RBL_SA (BL switch 80*i*).

Of these switches, the BL switch 8*ir* is controlled according to the BL isolation signal BLI, while the BL switch 8*irp* is controlled according to a BL isolation inverted signal (/BLI) generated by inverting the BL isolation signal BLI with the inverter INVr.

The inverter INVr may be provided at a position near a column unit, as shown in FIG. 8, or in the BLI control circuit 11C to send four types of control signals.

As described above, the BL switch 80(*i*) in the BLI circuit 8 is an NMOS transistor for controlling connection between the read bit line RBL and the RBL sense line RBL_SA.

Thus, one of the features of an embodiment of the present invention is that the read bit line RBL can electrically be isolated via the RBL sense line RBL_SA from the sense amplifier SA.

One of the features of the embodiment of the present invention is that electrical isolation (disconnection) and connection between the write bit line WBL and the WBL sense line WBL_SA is controlled by the write buffer WBUF provided in the connection control section 10A. Another feature of an embodiment of the present invention is that there is provided the reset transistor 10*rt* which operates in correlation with the write buffer WBUF.

The reset transistor 10*rt* is an NMOS transistor connected to the section between the write bit line WBL and the ground potential.

The write buffer WBUF is a two-stage inverter with a voltage of the WBL sense line WBL_SA applied thereto and also with the output terminal connected to the write bit line WBL. Each inverter has a PMOS transistor 41 in the high level power side and an NMOS transistor 42 in the low level power side. A PMOS transistor 44 is connected to a section between source electrodes of the two PMOS transistors 41 and a first power source in the high level side. An NMOS transistor 43 is connected to a section between source electrodes of the two NMOS transistors 42 and a second power source in the low level side.

THE PMOS transistor 44 is controlled together with the reset transistor 10rt according to an output (an inverted signal of the write enable signal WE) from the inverter INVw. The NMOS transistor 43 is controlled according to the write enable signal WE.

As clearly understood from the configuration described above, the write buffer WBUF is a 3-state buffer having a first output state in which a high level voltage is outputted for the electrical connection between input and output sides and rewritten in a memory cell, a second output state in which a low level voltage for the electrical connection between input and output sides and is rewritten in the memory cell, and an electrically disconnected state for electrical disconnection.

The "buffer" as used herein means a function to receive a power supply from the first power source in the high level side as well as from the second power source in the low level side and amplify a difference between the inputted "H" level signal and the inputted "L" level signal to a difference between a voltage of the first power and a voltage of the second power.

This function is not necessary when the SA array 6a includes a cross-coupled latch type sense amplifier like in this example, but is preferable to supplement a signal amplitude with the sense amplifier.

On the other hand, the reset transistor 10rt is turned ON when the PMOS transistor 44 of the write buffer WBUF is turned OFF and the input and output sides are not connected to each other, and has a function to fix a write bit line WBL at a constant voltage, at a ground potential in this case. This reset transistor 10rt is not essential, but provides the electro-magnetic shielding effect for preventing generation of induction noises due to capacitance coupling in the read bit line RBL by grounding other cells in the two sides in reading during which a potential in the read bit line RBL largely fluctuates, and, therefore, it is desirable to provide the reset transistor 10rt.

Connected to the sense line pair including the RBL sense line RBL_SA and the WBL sense line WBL_SA (described as RBL_SA, WBL_SA hereinafter) is a precharge circuit 50 having two precharge transistors PTr and PTw, each including a PMOS transistor. The precharge circuit 50 is provided in the column circuit 6 in FIG. 8.

The precharge transistor PTr has a drain electrode connected to the read bit line RBL and a source electrode connected to a supply line for a voltage VRBL. On the other hand, the precharge transistor PTw has a drain electrode connected to the write bit line WBL and a source electrode connected to a supply line for a voltage VWBL. The two precharge transistors PTr and PTw are controlled according to a common precharge enable signal PRE.

Furthermore, connected to the sense line pairs RBL_SA, WBL_SA is a cross-coupled latch type sense amplifier (described simply as a sense amplifier SA hereinafter).

This sense amplifier SA is an input terminal and an output terminal of an inverter including the PMOS transistor 21 and the NMOS transistor 22 and are cross-connected to each other, as shown in FIG. 8.

A PMOS transistor 23 controlled according to a low active SA enable inverted signal (/SAEP) is connected to a section between a common source electrode of the two PMOS transistors 21 and a power supply voltage line. On the other hand, an NMOS transistor 24, controlled according to a high active SA enable signal SAEN, is connected to a section between a common source of the two NMOS transistors 22 and the ground potential. The two SA enable signals (SAEN and /SAEP) are shared by other sense amplifiers SA (not shown) arrayed in the row direction respectively.

A BL selector 6B is provided as a circuit for electrically separating the sense line pair RBL_SA, WBL_SA, to which the sense amplifier SA is connected from other control circuits.

The BL selector 6B has a pair of a NMOS switches 61r connected to a section between the RBL sense line RBL_SA and a global read bit line GRBL and an NMOS switch 61W connected to a section between the WBL sense line WBL_SA and a global write bit line GWBL (NMOS switch pair) in each sense line pair RBL_SA, WBL_SA.

Figure 11:
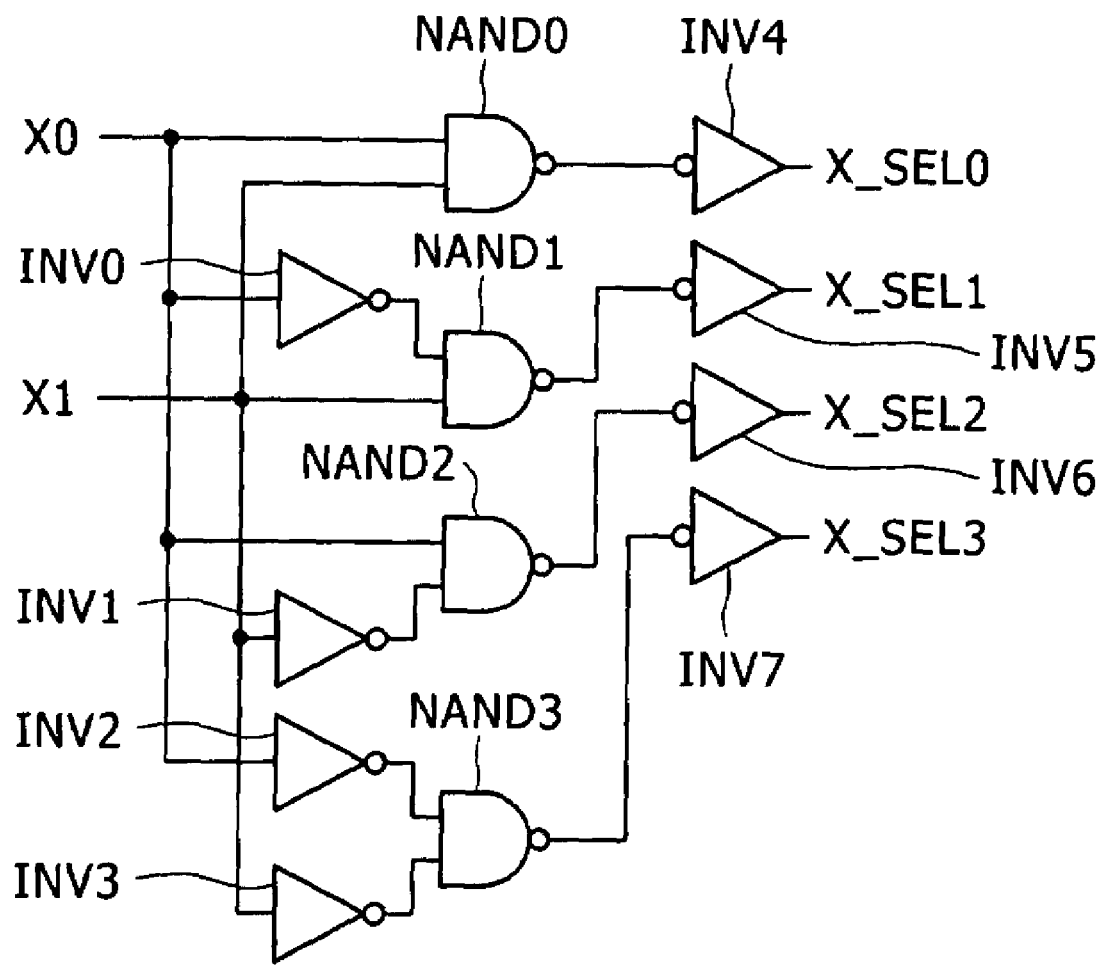
FIG. 11 is a circuit diagram illustrating an X selector.

FIG. 11 shows an example of a circuit for the X selector 20.

The X selector 20 shown in FIG. 11 includes four INV0 to INV3 in the front stage, four NAND circuits NAND0 to NAND3 in the middle stage, and four other inverters INV4 to INV7 in the rear stage.

The X selector 20 is a circuit which receives X address bits X0, X1 and activates (for instance, set high level) any of X select signals X_SEL0 to X_SEL3 in response to a result of decoding of the X address bits.

Figure 12:
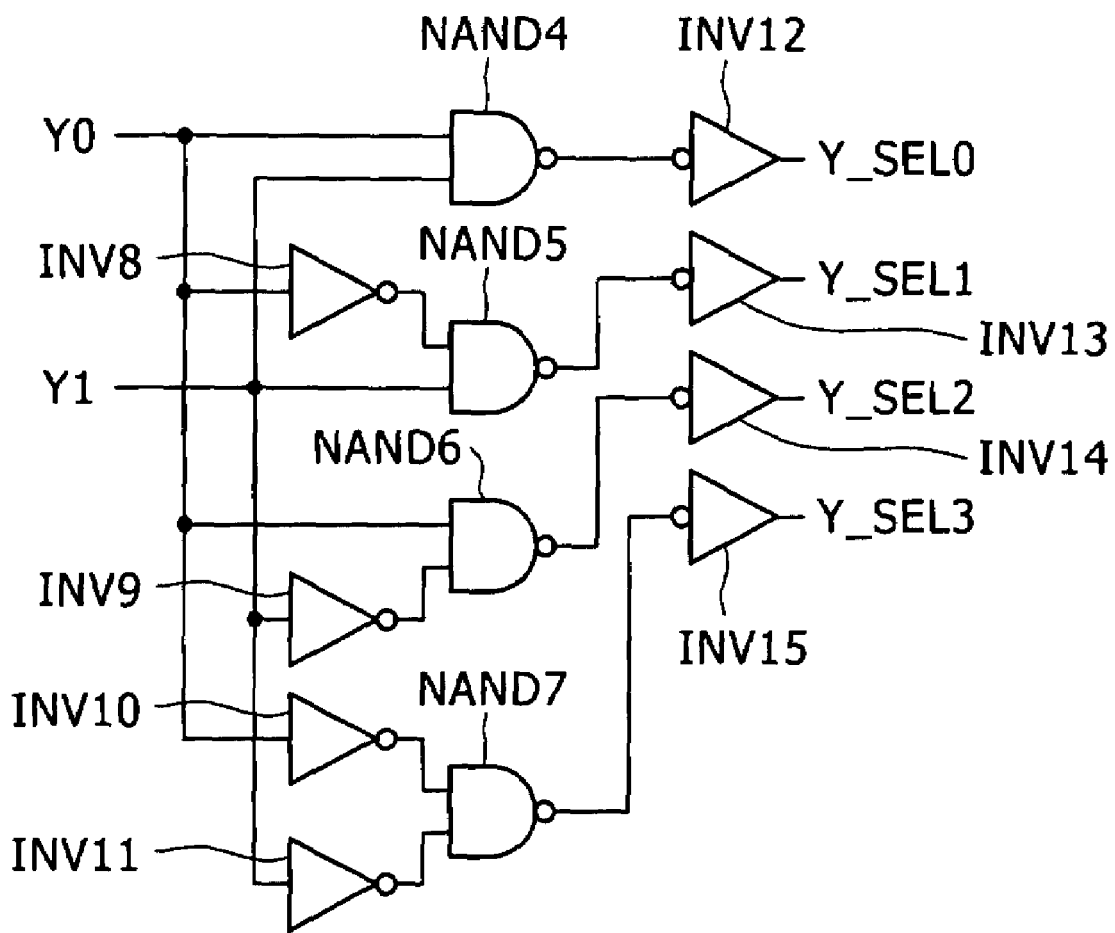
FIG. 12 is a circuit diagram illustrating a Y selector.

FIG. 12 is an example of a circuit for the Y selector 30.

The Y selector 30 shown in FIG. 12 includes four inverters INV8 to INV11 in the front stage, four NAND circuits NAND4 to NAND7 in the middle stage, and four other inverters INV12 to INV15 connected in the rear stage.

The Y selector 30 is a circuit which receives Y address bits Y0, Y1 and activates (for instance, sets high level) any of Y select signals Y_SEL0 to Y_SEL3 according to a result of decoding the bits.

Figure 13:
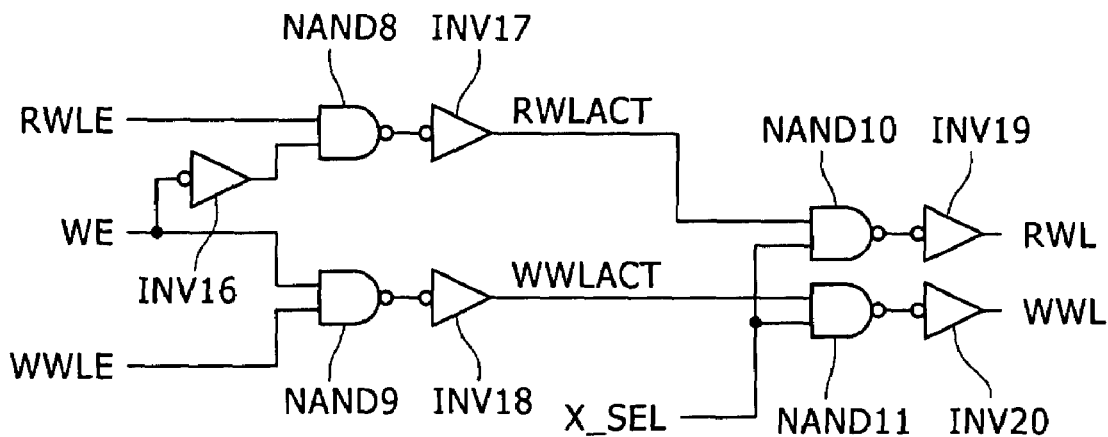
FIG. 13 is a circuit diagram illustrating a row decoder unit.

FIG. 13 illustrates an example of a circuit for the row decoder unit 40 which is a basic component of the word line decoder 4AB. The illustrated row decoder units 40 are provided by the number corresponding to the number N of cells along the column direction in the word line decoder 4AB (Refer to FIG. 9).

The N row decoder units 40 operate according to one X select signal X_SEL selected (activated) by the X selector 20 shown in FIG. 11 and activates 1 pair of word lines (read word line RWL and a write word line WWL) corresponding to a result of decoding a bit other than the X address bits X0, X1 in the X address signal. It is to be noted that the circuit portion activating any of the N row decoder units 40 according to a result of decoding a bit other than the X address bits X0, X1 is not shown in FIG. 13.

The row decoder unit 40 includes four NAND circuits NAND8 to NAND11, and five inverters INV16 to INV20.

The inverters INV16, INV17 and the NAND circuit NAND8 form a circuit for activating the read word line RWL. In this configuration, an RWL enable signal RWLE is applied to one of input terminals of the NAND circuit NAND8. The write enable signal WE is at a low level when not active (in the read mode). In this state, an output from the inverter INV16 is at a high level and is given to the other input terminal of the NAND circuit NAND8. Therefore, an output from the NAND circuit NAND8 is set at a low level, and is inverted by the inverter INV17 with the RWL activate signal RWLACT applied to one input terminal of the NAND circuit NAND10 (set at a high level).

In this state, when the X select signal X_SEL (any of the X select signal X_SEL0 to X_SEL3) applied to the other input terminal of the NAND circuit NAND10 is active (at a high level), an output from the NAND circuit NAND10 is set at a low level, and the read word line RWL connected to an output terminal of the inverter INV9 is activated at a high level.

The NAND circuit NAND9 and the inverter INV18 form a circuit for activating the write word line WWL.

The write enable signal WE is activated and becomes high level in the writing mode. This write enable signal WE is inputted to one of the input terminals of the NAND circuits NAND9, and the WWL enable signal WWLE is inputted to the other input terminal. Therefore, when both the write enable signal WE and the WWL enable signal WWLE are active (at a high level), an output from the NAND circuit NAND9 is set at a low level, and the output is inverted by the inverter INV18 to a WWL activate signal WWLACT applied to the other input terminal of the NAND circuit NAND11 activated (set at a high level).

In this state, when the Y select signal Y_SEL applied to the other input terminal of the NAND circuit NAND11 (any of the Y select signals Y_SEL0 to Y_SEL3) is active (at a high level), an output from the NAND circuit NAND11 is set at a low level, and the write word line WWL connected to an output terminal of the inverter INV20 is activated at a high level.

Figure 14:
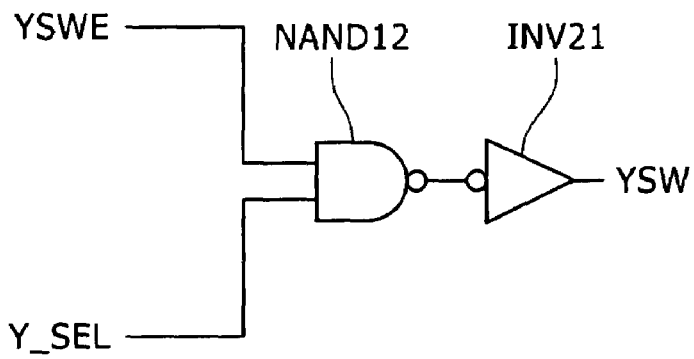
FIG. 14 is a circuit diagram illustrating a YSW gate circuit.

FIG. 14 illustrates an example of a YSW gate circuit 60.

The YSW gate circuit 60 shown in FIG. 14 includes one NAND circuit NAND12, and one inverter INV21 connected to one of the output terminals of the YSW gate circuit 60.

A Y switch enable signal YSWE is inputted to one input terminal of the circuit NAND12, and one Y select signal Y_SEL selected (activated) by the Y selector 30 shown in FIG. 12 is inputted to another input terminal of the NAND circuit NAND12. When both the Y switch signal YSW and the Y select signal Y_SEL are active (at a high level), an output from the NAND circuit NAND12 is set at a low level, and the Y switch signal YSW at an active level (high level) is outputted from the inverter INV21 to a BL selector 6B shown in FIG. 10.

Figure 15:
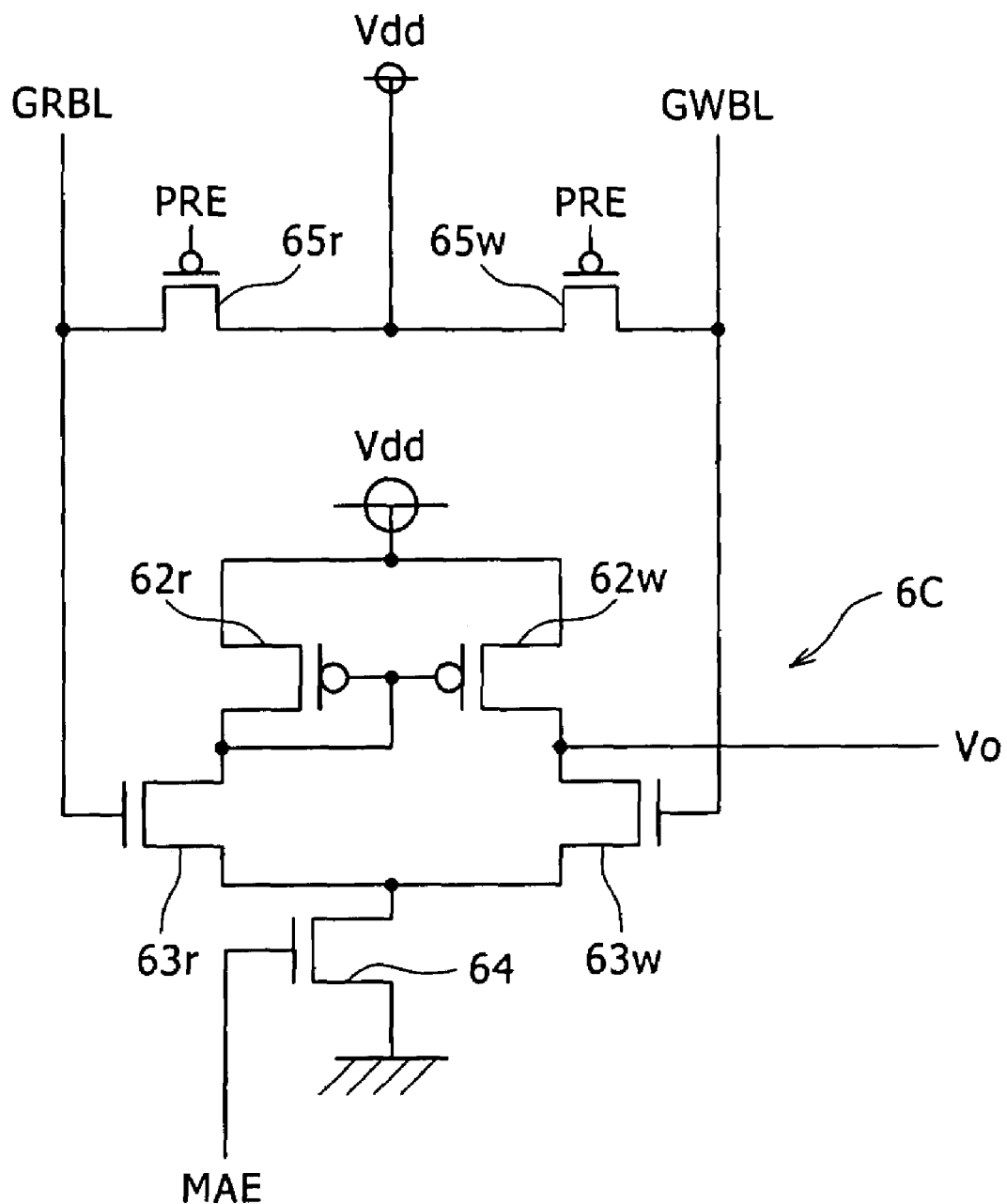
FIG. 15 is a circuit diagram illustrating a configuration of an amplifier circuit.

FIG. 15 is a view illustrating an example of an amplifier circuit connected to a global read bit line GRBL and to a global write bit line GWBL shown in FIG. 10.

An amplifier circuit 6C shown in FIG. 15 is provided in each column circuit 6, although not shown in FIG. 10.

The amplifier circuit 6C is a current mirror type of amplifier, and has two PMOS transistors 62r, 62w and three NMOS transistors 63r, 63w, and 64. The global read bit line GRBL is connected to a gate of the NMOS transistor 63r, and the global write bit line GWBL is connected to a gate of the NMOS transistor 63w.

The PMOS transistors 62r, 62w with the source and gate commonly connected are connected to a supply line for a power supply voltage Vdd, and the NMOS transistors 63r, 63w with the sources commonly connected are connected via an NMOS transistor 64 to a supply line of the ground potential. Drain electrodes of the PMOS transistor 62r and the NMOS transistor 63r are commonly connected, and the common connection point is connected to gates of the PMOS transistors 62r, 62w. Drain electrodes of the PMOS transistor 62w and the NMOS transistor 63w are commonly connected, and an output voltage Vo from the common connection point can be outputted. It is to be noted that data can be inputted from a latch circuit not shown in place of the output voltage Vo.

This amplifier circuit 6C is activated according to a main amplifier enable signal MAE supplied to a gate of the NMOS transistor 64.

The global read bit line GRBL can be connected via a PMOS transistor 65r to the power supply voltage Vdd, while the global write bit line GWBL is connected via a PMOS transistor 65w to the power supply voltage vdd. The PMOS transistors 65r, 65w are, like the precharge transistors PTr, PTw shown in FIG. 10, controlled according to the precharge enable signal PRE.

FIG. 16 illustrates an example of a driver circuit for generating a BL isolation signal BLI (described as BLI driver hereinafter). This BLI driver 110 is provided in a BLI control circuit 11c shown in FIG. 8 and FIG. 9, and corresponds to a "bit line switch control circuit" according to an embodiment of the present invention.

A BLI driver 110 shown in FIG. 16 has a delay section 111 including a prespecified number of buffers and two AND circuits NOR0, 1 for negative logic input (which are equivalent NOR circuits, and is described as NOR circuit NOR hereinafter).

An RWL enable signal RWLE can be inputted via the delay section 111 to one input terminal of the NOR circuit NOR. Another input terminal of the NOR circuit NOR0 is connected to an output terminal of the NOR circuit NOR1. One input terminal of the NOR circuit NOR1 is connected to an output terminal of the NOR circuit NOR0 from which the BL isolation signal BLI is outputted. A precharge enable signal PRE can be inputted to another input terminal of the NOR circuit NOR1.

<Control of a BL Isolation Signal>

Next, a description is provided for operations of the circuit shown in FIG. 16, namely for control of the BL isolation signal with reference to the timing chart shown in FIG. 17. In the following description, FIG. 10, FIG. 13, FIG. 16 and other related drawings are referred to according to the necessity.

In FIG. 17, sign Tpc denotes a "precharge period", sign Tsb a "standby period", and sign Tr a "read period" respectively. FIG. 17 illustrates combinations of signals for the four periods, and a sequence of the periods may be decided according to the necessity in the actual operation.

In the precharge period Tpc, because the precharge enable signal PRE is at a "L" level, as shown in FIG. 17A, both of the precharge transistor PTr, PTw are turned ON in a precharge circuit 50 shown in FIG. 10. Although not specifically shown in FIG. 10, both of the BL isolation signals BLI and the WBL isolation signal BLIW are at a "H" level, while the Y switch signal YSW is at a "L" level, and, therefore, the bit line pair RBL, WBL shown in FIG. 10 are precharged in the state where the sense line pair RBL_SA, WBL_SA are disconnected to the global bit line pair GRBL, GWBL.

A period of time from the time point when the precharge enable signal PRE is shifted to an inactive state ("H" level) until the RWL enable signal RWLE is shifted to an activated state ("H" level) is referred to as a standby period Tsb.

In the precharge period Tpc and in the standby period Tsb, the RWL enable signal RWLE is set at an "L" level where the signal is inactive, as shown in FIG. 17B. Furthermore, although not specifically shown, the write enable signal WE is set at an "L" level where the signal is inactive.

In these periods, one input terminal of the NOR circuit NOR0 shown in FIG. 16 is at the "L" level, the BL isolation signal BLI, which is a signal outputted from the NOR circuit NOR0 is at the "H" level (Refer to FIG. 17C).

As shown in FIG. 17B, when the RWL enable signal RWLE shifts to the "H" level, the read period Tr is started.

Then, after the delay time Td decided by the delay section 111 shown in FIG. 16 has passed, an output from the NOR circuit NOR0 is inverted, and the BL isolation signal BLI shifts to the "L" level (Refer to FIG. 17C). Therefore, the BL switches 8ir, 8iw shown in FIG. 10 are turned OFF, and the bit line pairs RBL and the sensor line pair RBL_SA are electrically disconnected. During the read period Tr, since the write enable signal WE not shown is at the "L" level, input and output terminals of the write buffer WBUF shown in FIG. 10 are in the disconnected state, and the reset transistor 10rt is turned ON with the write bit line WBL connected to the ground potential.

Furthermore, in the circuit shown in FIG. 13, when the RWL enable signal RWLE shifts to the "H" level, an RWL activate signal RWLACT outputted from the inverter INV17 shifts to the active level ("H" level), and as a result, a potential in the read word line RWL shifts to the "H" level and is activated. The activation of the read word line RWL is performed, in a memory cell block selected according to the X address bits X0, X1 in the X address signal, and based on a result of the decoding of other bits in the X address signal, to the one read word line RWL in the block.

As a result, data stored in a storage node SN of a prespecified memory cell in the activated read word line RWL is read out. Details of the read operation are described hereinafter.

When a write operation is performed after the read period Tr (rewrite), because the write enable signal WE not shown in activated, the buffer WBUF shown in FIG. 10 is turned ON, and read data is outputted to the write bit line WBL at a voltage level of the first power source or of the second power source. Details of operations of this write buffer WBUF are described later.

In FIG. 13, because the enable signal WE is at the "L" level before the write operation is performed, the WWL activate signal WWLACT, which is a signal outputted from the inverter INV18, is at the "L" level, and, therefore, a potential in the write word line WWL is at the "L" level, and the write word line WWL is not active.

In this state, when the write enable signal WE is activated to activate the WWL enable signal WWLE, an output from the NAND circuit NAND9 shown in FIG. 13 is inverted, and the WWL activate signal WWLACT is set at the active level, namely at the "H" level. As a result, the write word line WWL is activated. It is to be noted that activation of the write word line WWL is performed, in a memory cell block selected according to the X address bits X0, X1 in the X address, and based on a result of the decoding of other bits in the X address signal, to the one write word line WWL in the block.

As a result, a voltage (write data) preset in the write bit line WBL is written at a storage node SN of a prespecified memory cell in the activated write word line WWL. Details of the write operation are described hereinafter.

Then, when the precharge enable signal PRE shown in FIG. 17A shifts to an active level "L" level, precharging is again performed. In addition, both of the input terminals of the NOR circuit NOR0 shown in FIG. 16 are set at the "L" level, and the BL isolation signal BLI outputted from the NOR circuit NOR0 is inverted to a signal at the "H" level, as shown in FIG. 17C. Because of the inversion, the BL switches 8ir, 8iw are turned ON, and a precharge voltage in the bit line pair is supplied to a pair of sense lines RBL_SA, WBL_SA. When the write operation is over, input and output terminals of the write buffer WBUF are set in the disconnected state, and at the same time, the reset transistor 10rt is turned ON with the ground voltage applied to the write bit line WBL.

With the operations as described above, the state during the first precharge period is realized again.

In the following description, an operation for reading out data from the memory cell is divided to "H" data read and "L" data read. The following description assumes the operations described in relation to FIG. 17, and description is made by referring to FIG. 10, FIG. 13, FIG. 14, FIG. 16, and other related drawings according to the necessity. Therefore, detailed description is not provided for control over the BL isolation signal, nor for detailed operations of the circuits shown in FIG. 10, FIG. 13, and FIG. 16 under the control according to the signal.

<Operation for Reading "H" Data>

FIGS. 18A to 18K illustrate a timing chart when reading "H" data at the storage node SN illustrated in FIG. 1.

In FIG. 18 the time, a time Tr0, is a start time of a read period Tr and then the precharge period Tpc and the standby period Tsb, which are described, are controlled.

In the precharge period Tpc and the standby period Tsb, an application voltage of a BL isolation signal BLI is a power supply voltage Vdd (=1.8 V), as illustrated in FIG. 18E.

As a write enable signal WE is at the "L" level (FIG. 18C), the write bit line WBL and the WBL sense line WB_SA are disconnected by the write buffer WBUF illustrated in FIG. 10, and the write bit line WBL is connected to the ground by a reset transistor 10rt (FIG. 18I).

Furthermore, as illustrated in FIG. 18H, the Y switch signal YSW is at the "L" level. The Y switch enable signal YSWE which is inputted into a NAND circuit NAND14 in FIG. 14 is at the inactive "L" level, and, therefore, an output of the NAND circuit NAND14 is at the "H" level, that is, the Y switch signal YSW is at the "L" level. Then, when the precharge is performed, the bit line pair and the sense line pair are electrically isolated from the global bit line pair GRBL, GWBL.

First, the precharge enable signal PRE is set at the "H" level in the precharge period Tpc (FIG. 18A).

As illustrated in FIG. 18J, the RBL sense line RBL_SA read is precharged at the power supply voltage Vdd (for instance, 1.8 V) and the WBL sense line WBL_SA is precharged at the voltage VWBL (for instance, 1.8 V) respectively. Then, the BL isolation signal BLI is at the "H" level (=1.8 V) (FIG. 18E). The read bit line RBL and the RBL sense line RBL_SA are electrically connected to be the same potential. Thus, the precharge voltage (VRBL=1.8 V) is also transmitted to the read bit line RBL.

The PMOS transistors 65r and 65w in FIG. 15 are turned ON, and then the global read bit line GRBL and the global write bit line GWBL are precharged at the power supply voltage Vdd (=1.8 V) (FIG. 18K).

After performing the precharge, as illustrated in FIG. 18A, the precharge enable signal PRE is set at the "L" level, and then the read bit line RBL and the sense line pair (RBL_SA, WBL_SA) and the global bit line pair (GRBL, GWBL) are floated at the precharge state.

When the RWL enable signal RWLE in FIG. 17B reaches at the "H" level, the read word line RWL in FIG. 18B is activated, for instance, pulses of the power supply voltage Vdd are applied. Then, the select transistor ST is turned ON. At that time, the amplifier transistor AT is turned ON because the voltage of the storage node SN is at the "H" level. Thus, the voltages (=1.8 V) of the read bit line RBL and the RBL sense line RBL_SA are discharged via the select transistor ST and the amplifier transistor AT which are at the ON state, and then the voltages thereof are decreased to lower voltages than the WBL sense line WBL_SA (=1.4 V (FIGS. 18I and 18J)).

The voltage relation between the sense line pair is reversed by the time Tr1 at which the BL isolation signal BLI illustrated in FIG. 18E is decreased to the "L" level (=0 V). In other words, the time delay Td of the delay section 111 illustrated in FIG. 16 is determined so that the voltage relation of the bit lines is reversed and then the voltage difference thereof is readable.

When the BL isolation signal BLI is decreased to the "L" level during the time Tr1, loads, that is, a wiring load of the RBL sense line RBL_SA in FIG. 10 and a load of the sense amplifier SA, are disconnected from the read bit line RBL at the timing. Accordingly, as illustrated in FIG. 18J, the potential change of the RBL sense line RBL_SA is stopped.

During the subsequent time Tr2, the SA enable signal SAEN and the SA enable reverse signal (/SAEP) which are applied to the sense amplifier SA illustrated in FIG. 10 are activated, by which the sense amplifier SA is operated. As a result, as illustrated in FIG. 18J, the differential potential between the sense line pair RBL_SA, WBL_SA is amplified to a large amplitude between the power supply voltage Vdd and the ground potential level.

In a certain time Tr3 during amplification of the amplitude, the voltage of the read word line RWL is decreased (FIG. 18B).

Then, only the RBL sense line RBL_SA and the WBL sense line WBL_SA are sensed. The isolation of the load of the read bit line RBL provides the sense amplifier SA high-speed sense operation. In addition, no amplification of the potential of the read bit line RBL provides reduction in power consumption of the sense amplification SA.

When the sense operation begins, the BL isolation signal BLI is at the "L" level and the read bit line RBL is disconnected from the sense amplifier. If the read word line RWL remains at a high level, the cell current flow and the consumption current is increased. Accordingly, the read word line RWL is decreased to the "L" level during the time Tr3 illustrated in FIG. 18B. Consequently, the cell currents are stopped after the time above and the discharge of the read bit line RBL is stopped, which enables suppression of the amplitude change of the read bit line RBL with a large load and then provides low power consumption accordingly.

The sense line pair RBL_SA, WBL_SA activates the Y switch signal YSW, as illustrated in FIG. 18H, to raise to the "H" level at the timing (time Tr4) when the voltages thereof are sufficiently amplified. Accordingly, the NMOS switch pair 61r and 61w illustrated in FIG. 10 are turned ON, and the read data is transmitted to the global read bit line GRBL and the global write bit line GWBL (FIG. 18K).

The amplifier circuit 6C illustrated in FIG. 15 is connected to the global bit line pair GRBL, GWBL.

At the time Tr4, the global bit line pair GRBL, GWBL are connected to the sense line pair RBL_SA, WBL_SA. As a result, the potential of the global read bit line GRBL connected to the RBL sense line RBL_SA is discharged and then is decreased from the voltage 1.8 V. However, the voltage above is not decreased to the ground level by charge allocation in response to a load capacity.

After the above, the main amplifier enable signal MAE is activated ("H" level), and then the current mirror type amplifier circuit 6C is operated, although a specific timing chart is not illustrated. Therefore, the differential potential between the global read bit line GRBL and the global write bit line GWBL is amplified to an amplitude signal of the power supply voltage Vdd in the amplifier circuit 6C. The signal (read data) after the amplification is transmitted from the amplifier circuit 6C to a subsequent circuit, as an output signal Vo. Namely, the read data is outputted from the column circuit 6 illustrated in FIG. 8, via the I/O buffer 9, to the outside.

At the time Tr5, a necessary control signal is returned to the precharge state and then the read operation is terminated.

<Operation for Reading "L" Data>

FIG. 19A to FIG. 19K are timing charts for reading "L" data at the storage node SN shown in FIG. 1. In relation to the figures above, only the points different from those in <"H" data read> above are described below.

The basic controls and operations are the same as those in reading "H" data. Namely, precharging is performed with the voltage VRBL (1.8 V) or the voltage VWBL (1.4 V) to the read bit line RBL and to the sense line pair RBL_SA, WBL_SA, and a potential in the write but line WBL is fixed at the ground potential. At the same time, precharging is performed to the global bit line pair GRBL, GWBL with the power supply voltage Vdd (1.8 V). Furthermore the read word line RWL is initialized in the read period Tr0, and then after passage of the delay time Td, the BL isolation signal BLI is dropped, and these operations are the same as those in "H" data read.

When reading "L" data, the amplifier transistor AT shown in FIG. 1 is not turned ON, and, therefore, even when the read word line RWL is initialized at the time point Tr0, discharge from the read bit line RBL does not occur. Therefore, as shown in FIG. 19I and FIG. 19J, voltages in the read bit line RBL and the RBL sense line RBL_SA are remained at the power supply voltage Vdd.

At the time point Tr1, the BL isolation signal BLI is dropped, and at the time point Tr2, the sense amplifier SA is activated. With this functional configuration, voltage in the light load WBL sense line WBL_SA, in which the write enable signal WE is always kept at the "L" level and is isolated by the write buffer WBUF from the write bit line WBL, is amplified from the precharge voltage of 1.4 V to the ground level.

Then, like in reading "H" level data, the Y switch signal YSW is activated, and data read is performed by operating the amplifier circuit 6C shown in FIG. 15.

In the operations for reading data at the "H" or "L" level as described above, for performing a sensing operation during a period from the time point Tr2 until the time point Tr3, a load viewed from the sense amplifier SA, namely a wiring load in the read bit line RBL, a wiring load in the write bit line WBL, and a load in N memory cells MCa are electrically isolated from the sense line par RBL_SA, WBL_SA by the BLI circuit 8 and the write buffer WBUF. Because of this feature, the sense amplifier performs the sensing operation at a high speed.

Furthermore, because amplification of a potential is not performed in the read bit line RBL, nor in the write bit line WBL, power consumption in the sense amplifier SA is low.

When the sensing operation is performed at a high speed, a period during which an input node potential in the sense amplifier SA is between the power supply voltage Vdd and the ground level becomes shorter. Therefore, a current flowing through an inverter formed with the PMOS transistor 21 and the NMOS transistor 22 in the sense amplifier SA can be reduced, and also in this sense, power consumption in the sense amplifier can be made smaller.

<Data Write>

Next, operations for writing data into a memory cell are described below.

Data write operations are divided to those for writing "H" data to set a voltage in the storage node SN shown in FIG. 1 at a high level, and those for writing "L" data therein. Furthermore, the operations are divided to those when "H" data is stored in the storage node SN before the write operation and those when "L" data is stored in the storage node SN before the write operation.

FIG. 20A to FIG. 20K are timing charts for writing inverted data "L" when "L" data is stored in the storage node SN, and FIG. 21A to FIG. 21K are timing charts for writing inverted data "H" when "L" data is stored in the storage node SN. The timing charts assume a case in which stored data is read out from a memory cell as an object for the data write operation, the stored data is inverted on the write bit line WBL to set new write data, and the newly set write data is written in the memory cell.

In the read operation shown in FIG. 18 and FIG. 19, the write enable signal WE is kept inactive (At the "L" level) during the read period Tr.

In contrast, in the data write operation, before the Y switch signal YSW is initialized, as shown in FIG. 20H and FIG. 21H, the write enable signal WE is set at the "H" level, as shown in FIG. 20C and FIG. 21C. The write period Tw is started at this time point (Tw0).

In either one of the operations shown in FIG. 20 and FIG. 21, it is necessary that the operations for precharging and data read are performed and a voltage is previously set for rewriting the data in the global write bit line GWBL before the start of the write period Tw. The reason is as described below.

FIG. 10 illustrates a configuration in which only a row of memory cell arrays and a control circuit for the memory cell arrays are provided (hereinafter referred to as a column unit). In an actual semiconductor memory, the configurations as described above are repetitively arranged along the row direction. The memory cells in one line share the write word line WWL and the read word line RWL.

When random-accessing data in the semiconductor memory as described above is necessary to write data in a memory cell having a prespecified memory capacity such as 1 byte (8 bits). In this step, write data is set in the global write bit line GWBL in a column unit as an object for data write, the Y switch signal YSW is activated, and a potential in the write bit line WBL is forcefully updated with this write data.

Figure 3:
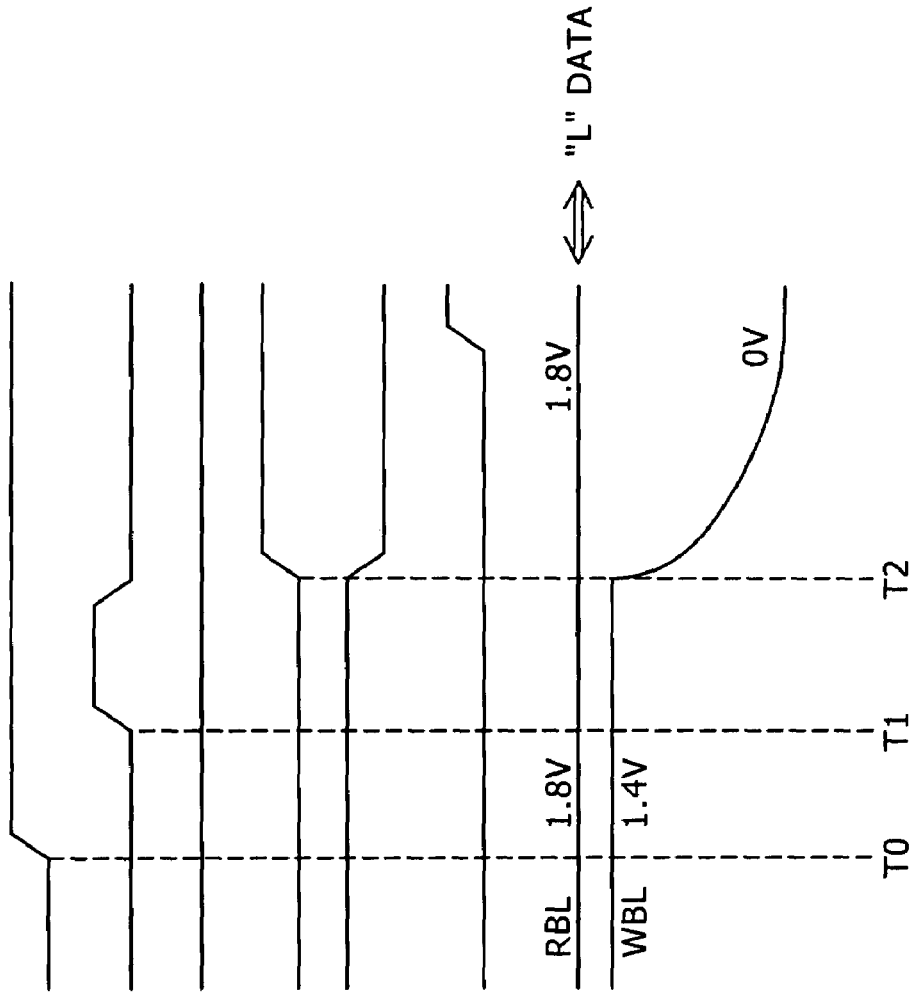
FIG. 3A to FIG. 3G are timing charts for reading out "L" data in the configuration shown in FIG. 2.
Figure 4:
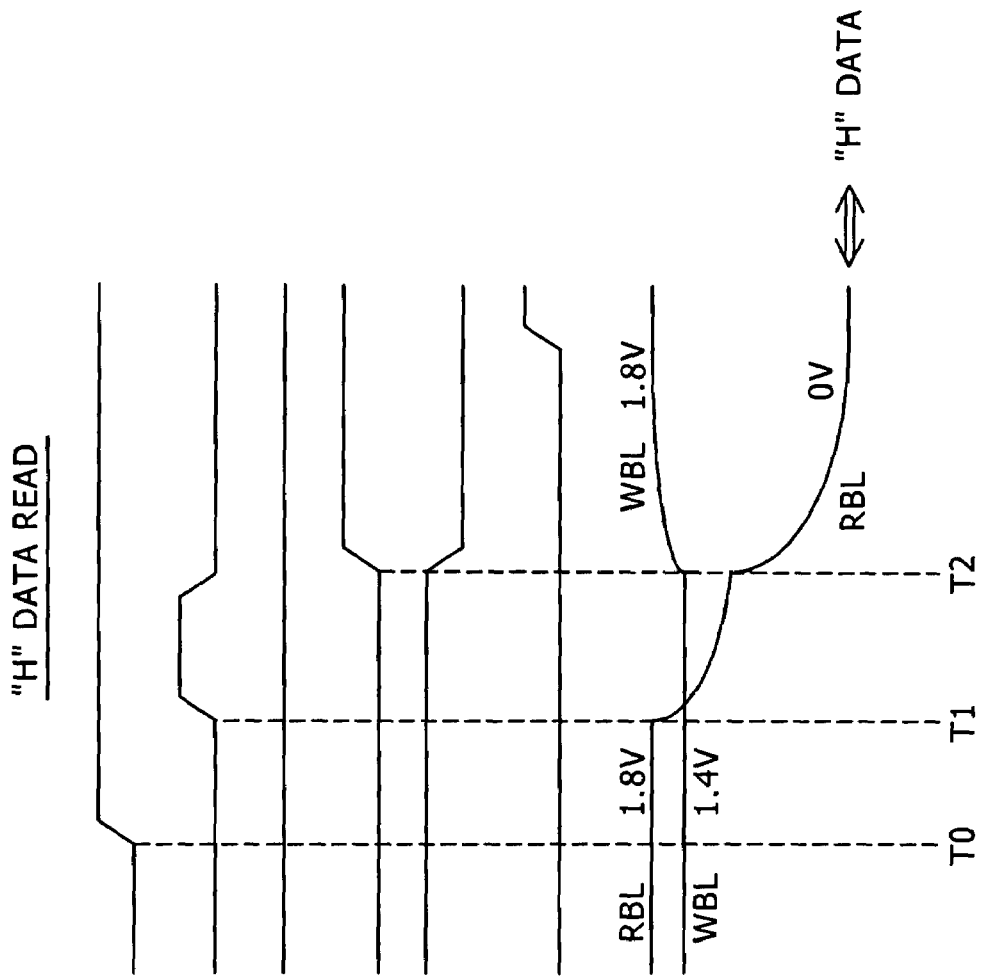
FIG. 4A to FIG. 4G are timing charts for reading out "H" data in the configuration shown in FIG. 2.

On the other hand, in the column unit in which any data is not written, the refreshing operation as described below is performed. When data stores in the memory cell is read out onto the read bit line RBL, the read-out data has been inverted in its logic from the data stored in the cell (Refer to FIG. 18J and FIG. 19J). Therefore, it is required that a refresh voltage corresponding to a logic of cell-stored data appears on the write bit line WBL. (The refresh voltage appears in FIG. 3 and FIG. 4).

In this embodiment, however, when data is read out, the bit line pair RBL, WBL are isolated from the sense line pair RBL_SA, WBL_SA, and in addition, a potential in the write bit line WBL is left at the ground potential (Refer to FIG. 18(I) and FIG. 19(I)), the refreshing operation can not be performed in the state.

To solve the problem as described above, in this embodiment it is necessary to perform a read operation before a write operation is performed, a refresh voltage is previously set in the global write bit line GWBL in a column unit which is not selected and, therefore, is not an object for the data write operation. In addition it is necessary to forcefully rewrite the refresh voltage with write data from the outside only in the column unit as an object for the write operation.

However, because a voltage for writing "L" data (FIG. 20) is inverted from that for writing "H" data (FIG. 21), and, therefore, voltages in the global read bit line GRWL and the global write bit line GWBL are in the mutually inverted relation, as shown in FIG. 20 and FIG. 21.

More specifically, when writing "L" data, a voltage at a high level (=1.8 V) is set in the read bit line GRBL, as shown in FIG. 20K, and a voltage at a low level (=0 V) is set in the global write bit lint GWBL.

In contrast, when writing "H" data, a voltage at a low level (=0 V) is set in the global read bit line GRBL, as shown in FIG. 21K, and a voltage at a high level (=1.8 V) is set in the global write bit line GWBL.

The read operation performed until the time point Tr3 in FIG. 20 and FIG. 21 is the same as that described with reference to FIG. 18 and FIG. 19, and, therefore, description is omitted.

After the read operation by means of voltage sensing is started at the time point Tr2, at the time point Tw0 when a voltage difference in the sense line pair RBL_SA, WBL_SA has become sufficiently large, the write enable signal WE is set at the "H" level and is activated, as shown in FIG. 20C and FIG. 21C.

When the circuit operation already described with reference to FIG. 17 is performed and the write enable signal WE is set at the "H" level, load of the ground potential to the write bit line WBL is released and also the write buffer WBUF is activated, and the output is driven to the power supply voltage Vdd or 0 V in response to the input voltage. Because of the operation, especially when the WBL sense line WBL_SA is set at the "H" level, as shown in FIG. 20, the write buffer WBUF drives the write bit line WBL connected to the output terminal of the write buffer WBUF from 0 V to the power supply voltage Vdd (=1.8 V). (Refer to FIG. 20I.) On the other hand, in the case shown in FIG. 21, voltage change does not occur in the write bit line WBL. It is to be noted that, as shown in FIG. 20E and FIG. 21E, the read bit line RBL and the RBL sense line RBL_SA remain in the electrically disconnected state, so that the BL isolation signal BLI is preserved at the "L" level.

At the time point Tw1, the Y switch signal YSW is activated by the YSW gate circuit 60 shown in FIG. 14, and in the selected column unit including a cell as an object for data write, a voltage in the RBL sense line RBL_SA and a voltage in the WBL sense line WBL_SA electrically connected thereto are reversed in the magnitude relation.

In this step, the voltage reversal is performed in the read bit line RBL in the state in which load in the memory cell array is isolated, and, therefore, voltage reversal in the RBL sense line RBL_SA is performed at a high speed. Furthermore, because the read bit line RBL is not amplified, power consumption in the amplifier circuit 6C is reduced proportionately. Voltage reversal performed at a high speed enables shortening of a period of time in which an input terminal of the sense amplifier SA is at an intermediate voltage, namely in which the input terminal voltage is between the voltage at the ground level and the power supply voltage Vdd. Therefore, it is possible to reduce a current flowing therethrough when the sense amplifier SA is reversed, which in turns enables reduction of power consumption.

Then, at the time point Tw2, when the voltage reversal has sufficiently been completed, the write word line WWL is set at a high level for activation, as shown in FIG. 20D and FIG. 21D. With this operation, in the memory cell connected to the activated write word line WWL within the selected column unit, the write transistor WT shown in FIG. 1 is turned ON, and "L" or "H" write data forcefully set in the write bit line WBL is written in the storage node SN.

<Refresh Operation>

Next, description is provided for an operation for refreshing a cell not selected in the data write operation.

FIG. 22A to FIG. 22K are timing charts for the operation performed when a voltage in a storage node is "H", while FIG. 23A to FIG. 23K is timing charts for the operation performed when a voltage in the storage node is "L".

Column control for a not-selected cell as a target for the refresh operation is different from that for a selected cell in the point that, as shown in FIG. 22K and FIG. 23K, data is not set in the global bit line pair GRBL and GWBL and, therefore, both of the bit lines are kept at the precharge voltage of 1.8 V, and also in the point that the Y switch signal YSW is not turned ON. (Refer to FIG. 22H and FIG. 23H.)

As already described with reference to FIG. 20 and FIG. 21, also in the refresh operation, when the write enable signal WES is activated, a potential in the write bit line WBL changes in response to data read out onto the sense line pair RBL_SA, WBL_SA, and, therefore, the data stored in the storage node SN is set in the write bit line WBL. Then, by initializing the write word line WWL, the data is rewritten.

Next, variations of the present embodiment are described.

<Variation of a BLI Circuit>

Although the reset transistor 10*rt* is fixed at the ground level voltage by the NMOS transistor in FIG. 10, the reset transistor 10*rt* may be fixed at the power supply voltage Vdd by the PMOS transistor. Also the reset transistor may be reset at a voltage between the power supply voltage Vdd and the ground level voltage. A reset voltage for the write bit line WBL gives influences over an amount of the off-leak current of the write transistor WT, and, therefore, the reset voltage for the write bit line WBL should preferably be set at an appropriate potential by taking into consideration the influences.

The BLI switch 80(*i*) shown in FIG. 10 is formed with a transfer gate based on a combination of an NMOS transistor and a PMOS transistor, but the BLI switch 80(*i*) may be formed only with an NMOS transistor or only with a PMOS transistor.

When the BLI switch is formed only with an NMOS transistor or only with a PMOS transistor, upper limits for the read bit line RBL and the write bit line WBL are lower by the threshold voltage Vth for the BL switch as compared to a gate voltage in the BL switch. Because of the feature, it is necessary to raise or drop an activation voltage for the BL isolation signal BLI when writing data. Furthermore, when the BLI switch is formed with a PMOS transistor, logic for reversal of the BL isolation signal BLI is again reversed from that when the BLI switch is formed with an NMOS transistor.

In contrast, when the BL switch is formed with a transfer gate, as shown in FIG. 23, the device number of the voltage BL switches increases, and, therefore, it is required that the BL isolation signal BLI and the WBL isolation signal BLIW are complementary to each other, which disadvantageously results in an increase of the wiring area. However, it is not necessary to raise a voltage level for activation of the BL isolation signal BLI and the WBL isolation signal BLIW. Therefore, a configuration of the peripheral circuit can advantageously be simplified.

Figure 24:
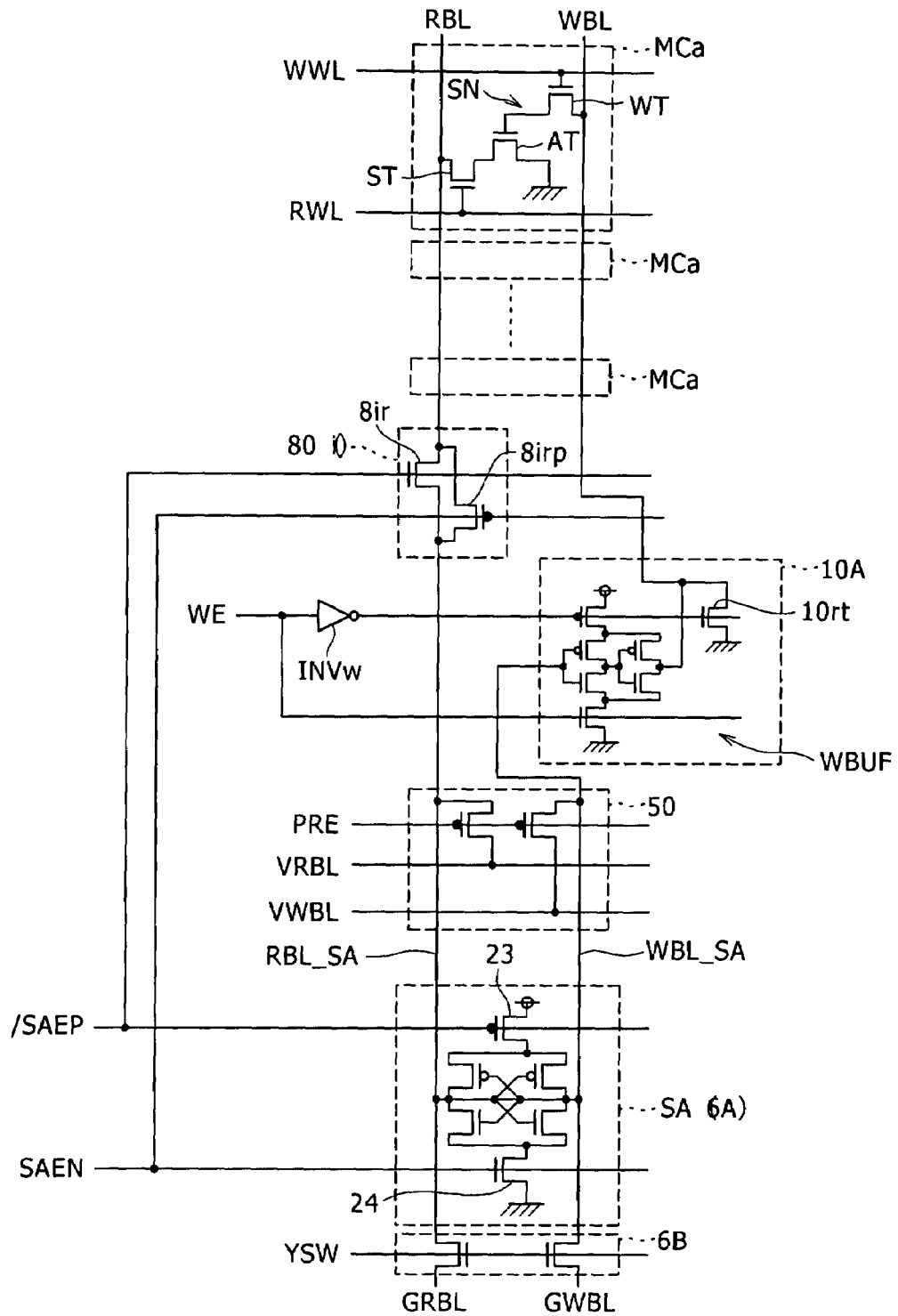
FIG. 24 is a circuit diagram illustrating a column unit which is a variant of the BL switch control.

FIG. 24 is a view illustrating a variation of a control signal for the BL switch.

In the circuit shown in FIG. 24, a control signal for the BL switch 80(*i*) is commonly used for the SA enable signal SAEN and the SA enable inversion signal (/SAEP). Namely, the SA enable signal SEAN is loaded to a gate of the BL switch 8*irp*, and the SA enable inversion signal (/SAEP) is loaded to a gate of the BL switch 8*ir*.

With the circuit configuration, the number of control signals can advantageously be reduced as compared to that in the configuration shown in FIG. 10.

Figure 25:
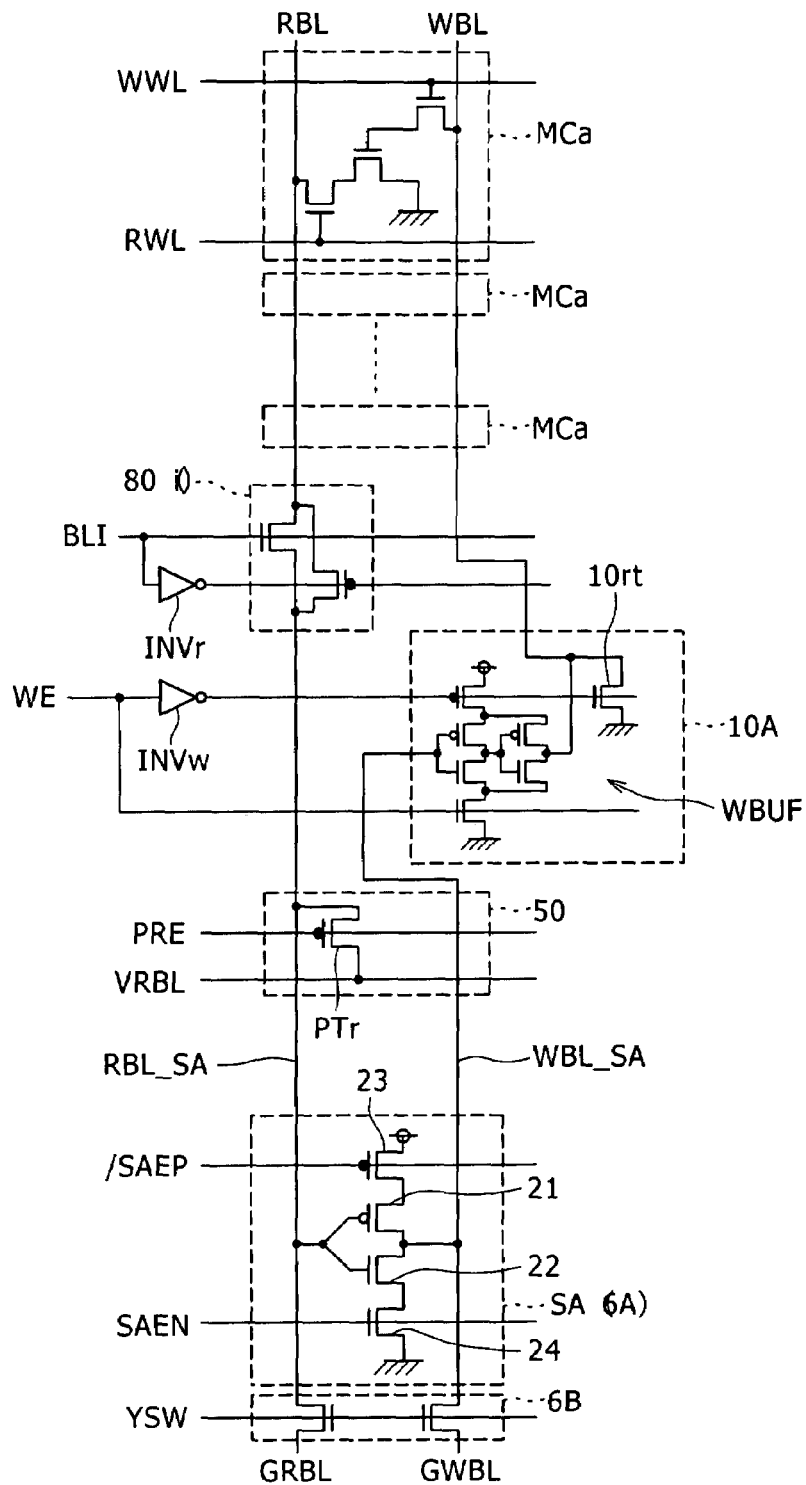
FIG. 25 is a circuit diagram illustrating a column unit which is a variant of a sense amplifier.

FIG. 25 shows a variation of the sense amplifier SA.

In the sense amplifier SA shown in FIG. 25, there is provided an inverter including a PMOS transistor 21 and an NMOS transistor 22, and an input terminal of the inverter is connected to the RBL sense line RBL_SA with the output terminal connected to the WBL sense line WBL_SA. This sense amplifier is referred to as single end type, and a threshold voltage for the inverter is a reference voltage. In this circuit, the number of devices constituting the sense amplifier is small, and precharge control for the write bit line WBL_SA with the voltage VWBL and a precharge voltage are not required. More specifically, in the precharge circuit 50 shown in FIG. 25, the precharge transistor PTw is not required.

Figure 26:
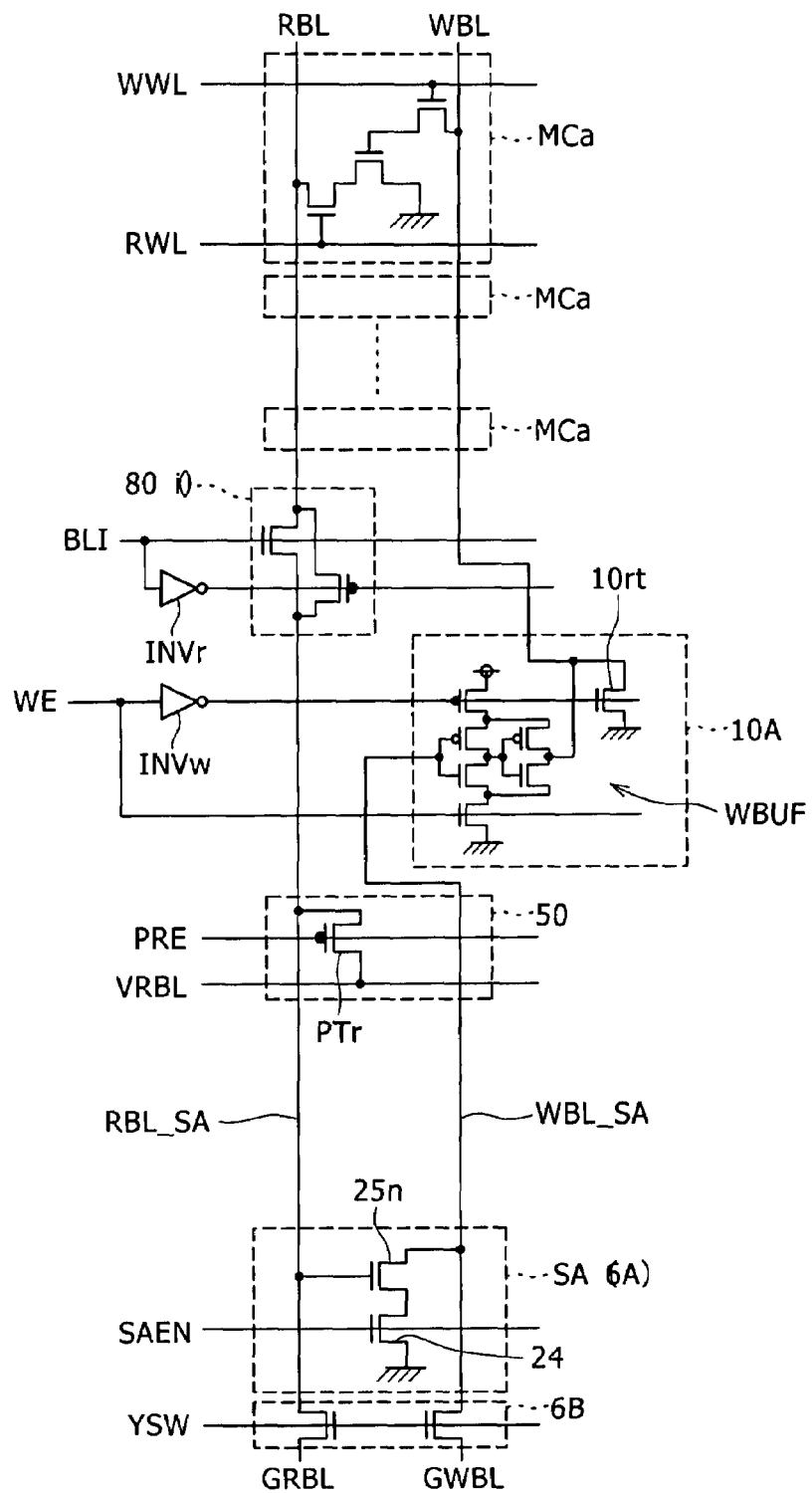
FIG. 26 is a circuit diagram illustrating a column unit which is another variant of the sense amplifier.
Figure 27:
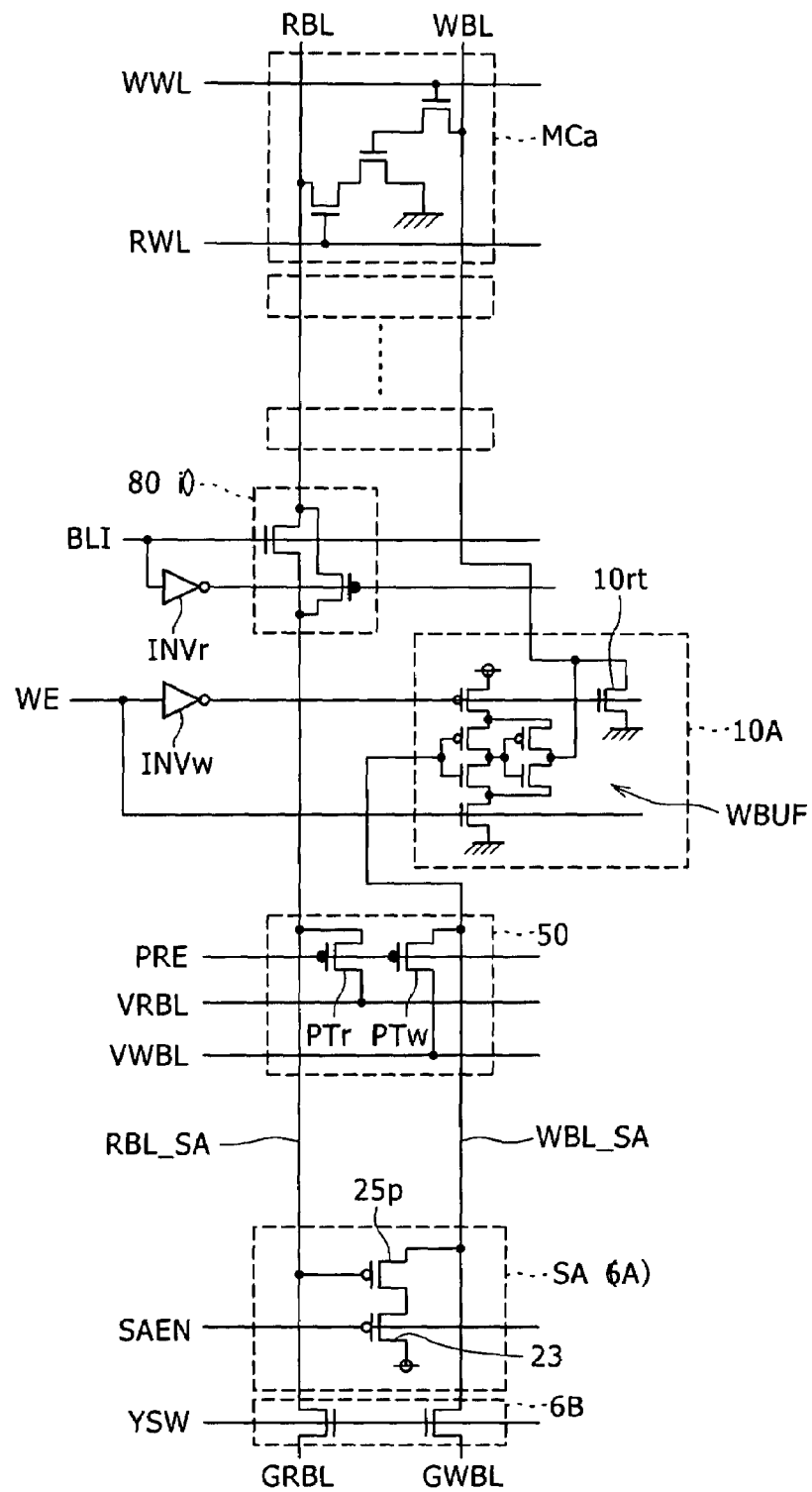
FIG. 27 is a circuit diagram illustrating a column unit which is still another variant of the sense amplifier.

FIG. 26 and FIG. 27 are views each illustrating a configuration in which the same advantage as that shown in FIG. 26 are provided and the number of component devices are reduced.

The sense amplifier SA shown in FIG. 26 has NMOS transistors 25*n*, 24 serially connected to a section between the WBL sense line WBL_SA and the grounding point, and a gate of the NMOS transistor 25*n* functions as an input terminal. In this configuration, a threshold voltage for the NMOS transistor 25*n* is a reference voltage.

In the sense amplifier SA shown in FIG. 27, the PMOS transistors 23, 25*p* are serially connected to a section between a power supply voltage and the WBL sense line WBL_SA, and a threshold voltage for the PMOS transistor 25*p* is a reference voltage.

Figure 28:
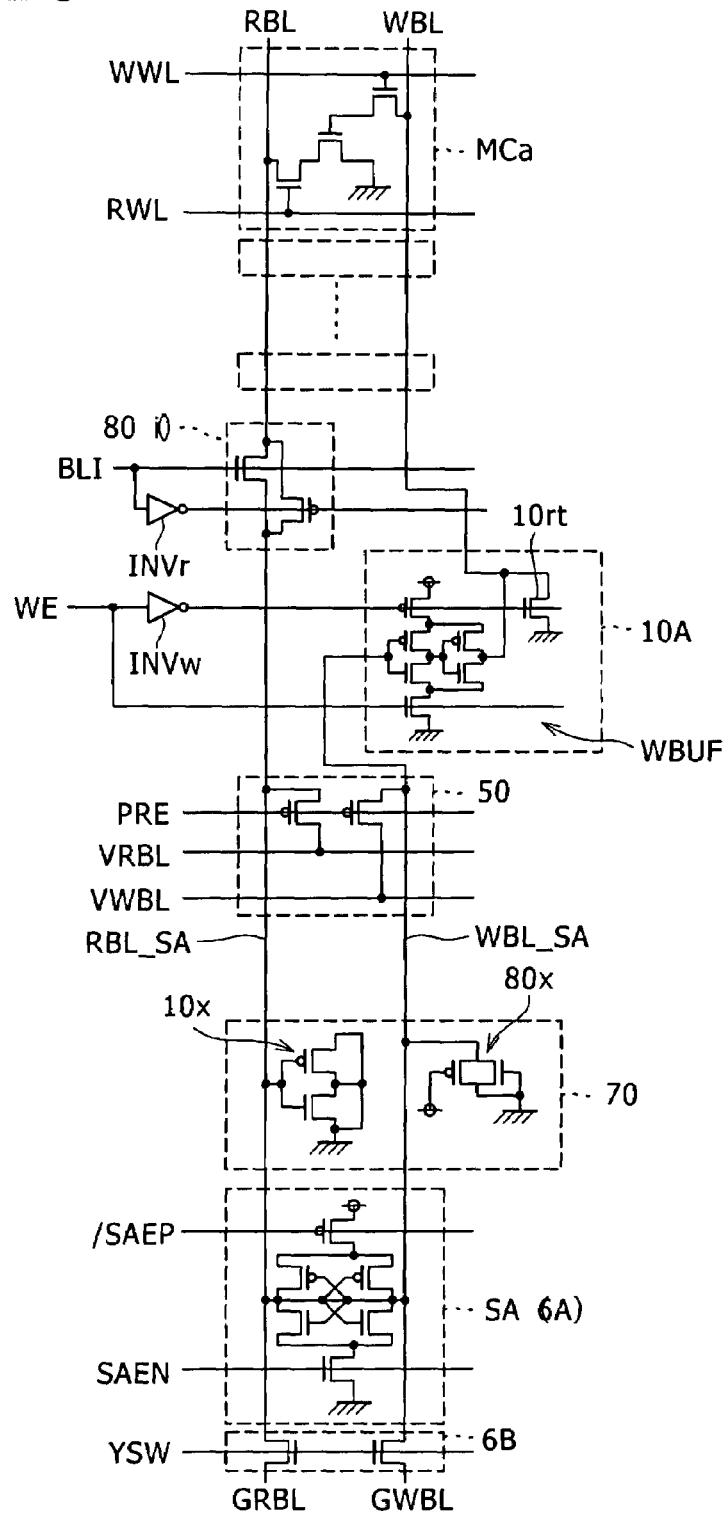
FIG. 28 is a circuit diagram in which a load circuit is added.

FIG. 28 shows a configuration of a circuit in which a capacitance imbalance in a sense node pair is corrected.

A capacitance imbalance in a sense node pair causes a read error, which makes it impossible for a cross-coupled type sense amplifier SA to accurately sense a potential difference. To solve this problem, a load circuit 70 is additionally provided. In the load circuit 70, a load capacitance is balanced by connecting an additional circuit 10*x* like an input inverter for the write buffer WBUF as a load to the RBL sense line RBL_SA and furthermore connecting the CMOS transistor like the BL switch 80(*i*) as a load to the WBL sense line WBL_SA.

The memory cell according to the embodiments the present invention is not limited to the configuration shown in FIG. 1, and can widely be applied to a configuration in which a voltage in the storage node SN is amplified by an amplifier transistor and read out. Also the configuration may be allowed in which a high level voltage in the storage node SN is raised via a capacitor when writing or reading data.

Figure 5:
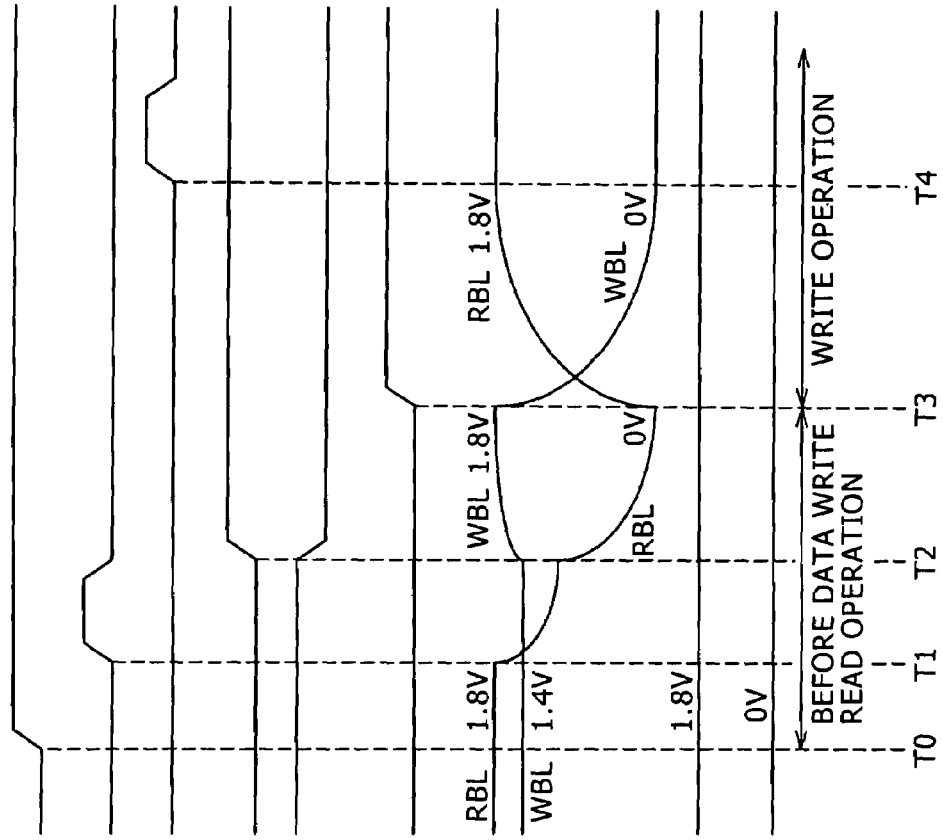
FIG. 5A to FIG. 5I are timing charts for writing "L" data in the configuration shown in FIG. 2.
Figure 6:
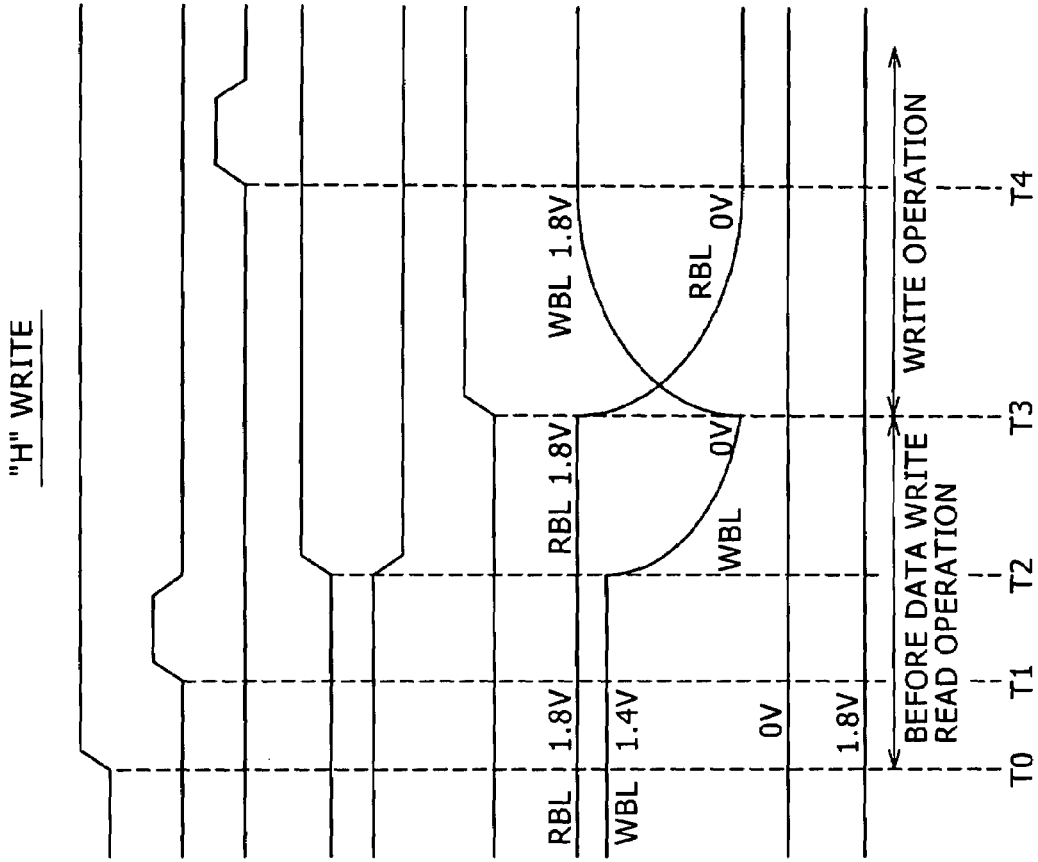
FIG. 6A to FIG. 6I are timing charts for writing "H" data in the configuration shown in FIG. 2.
Figure 7:
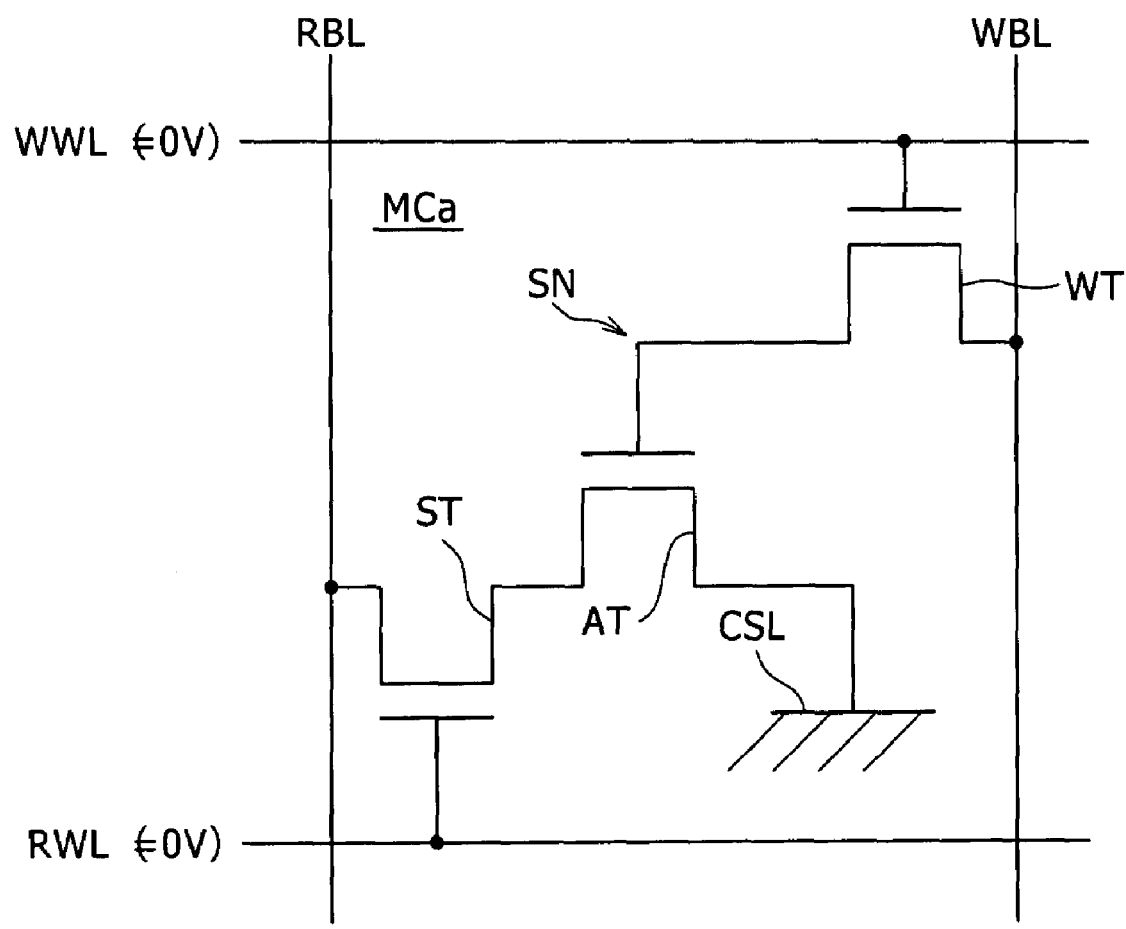
FIG. 7 is an equalizing circuit diagram illustrating the state in which a gain cell based on the background technology stores data therein.

With the present embodiment, as described in the last paragraph in the section for data read, the time required for sensing a voltage from the time point Tr2 until the time point Tr3 can be shortened because of operations of the BLI circuit 8, and thereby a high-speed operation for sensing a voltage can advantageously be performed. Therefore, it is advantageous that the power consumption of the sense amplifier SA is reduced. The voltage sensing time from the time point Tr2 until the time point Tr3 corresponds to the period of time from the time point T2 until the time point T3 in FIG. 5 and FIG. 6, and it is clearly understood that the voltage sensing time is shortened.

In the embodiments of the present invention, as described in a paragraph in <Data write operation>, the time required for inversion of voltages in the bit line pair from the time point Tw1 until the time point Tw2 can be shortened. Furthermore, because of the synergetic effect of shortening of the time required for a read operation performed prior to a write operation, the write operation cycle time can substantially be shortened, which is advantageous. Furthermore, in relation to the features as described above, there is provided the advantage that power consumption in the amplifier circuit 6C and in the sense amplifier SA can be reduced. The time for voltage reversal until the time point Tw1 until the time point Tw2 corresponds to a period of time from the time point T3 until the time point T4 in FIG. 5 and FIG. 6. Therefore, it can also be understood that the time required for voltage reversal is shortened.

As described in <Data write operation>, the advantage of reduction of power consumption in the amplifier circuit 6C and the sense amplifier SA can also be provided in a column unit including both a target cell for a write operation and a not-selected cell in the same line.

As described above, by applying the embodiments of the present invention, realization of a high speed operation and reduction of power consumption in a semiconductor memory device can simultaneously be achieved.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor memory device comprising:
   a memory array with memory cells array-like arranged;
   a read bit line connected to a data output node of the memory cells and shared by a plurality of the memory cells arranged in one direction in the memory array;
   a write bit line connected to a data input node of the memory cells and shared by a plurality of the memory cells;
   a sense amplifier for sensing a voltage of the reading bit line;
   a first sense line and a second sense line connected to the sense amplifier;
   a read bit line switch for controlling electrical connection and disconnection between the first sense line and the read bit line; and
   a write buffer connected between the second sense line and the write bit line, capable of controlling electrical connection and disconnection between the second sense line and the write bit line.

2. The semiconductor memory device according to claim 1, wherein the write buffer is a three-state buffer having three states including a first output state for outputting a high-level voltage for electrically connecting between an input and an output to write back data to the memory cells, a second output state for outputting a low-level voltage for electrically connecting between the input and the output to write back data to the memory cells, and an electrical disconnection state between the input and the output.

3. The semiconductor memory device according to claim 1 further comprising:
   a bit control circuit; and
   a write control circuit,
   wherein a signal for controlling the read bit line switch is supplied from the bit line switch control circuit and a signal for controlling the write buffer is supplied from the write control circuit.

4. The semiconductor memory device according to claim 1 further comprising:
   a bit control circuit; and
   a write control circuit,
   wherein a signal for controlling the read bit line switch is supplied from the bit line switch control circuit and a signal for controlling the write buffer is shared with a signal outputted from the read control circuit for controlling the sense amplifier.

5. The semiconductor memory device according to claim 1, wherein the sense amplifier is a cross coupled latch sense amplifier that is connected between a high-level of power supply voltage and a low level of power supply voltage and senses a differential voltage between voltages of the first sense line and the second sense line and then amplifies the high-level power supply voltage and the low level power supply voltage.

6. The semiconductor memory device according to claim 1, wherein the sense amplifier is a single-ended sense amplifier that has an inverter of which a threshold is a reference voltage.

7. The semiconductor memory device according to claim 1, wherein the sense amplifier is a single-ended sense amplifier where a threshold of an inside NMOS transistor is a reference voltage.

8. The semiconductor memory device according to claim 1, wherein when the write buffer controls electrical disconnection between the write bit line and the second sense line, the second sense line is connected to a reset switch for applying a constant voltage to the second sense line.

9. The semiconductor memory device according to claim 1, wherein the bit line switch control circuit controls the read bit line switch to turn to an ON state in a standby state in which a memory is not accessed.

10. The semiconductor memory device according to claim 1, wherein the bit line switch control circuit turns the read bit line switch to an OFF state at a specified period time passed after the read word line is activated and then discharge of the read bit line begins, and turns the read bit line switch to the ON state again when the bit line state is returned to the standby state being not accessed memory cells.

* * * * *